(12) United States Patent
Uchida et al.

(10) Patent No.: US 10,304,884 B2
(45) Date of Patent: May 28, 2019

(54) IMAGING DEVICE AND METHOD FOR MANUFACTURING THE SAME

(71) Applicant: SONY SEMICONDUCTOR SOLUTIONS CORPORATION, Kanagawa (JP)

(72) Inventors: Shiro Uchida, Tokyo (JP); Akiko Honjo, Kanagawa (JP); Tomomasa Watanabe, Kanagawa (JP); Hideshi Abe, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/744,917

(22) PCT Filed: May 6, 2016

(86) PCT No.: PCT/JP2016/063675
§ 371 (c)(1),
(2) Date: Jan. 15, 2018

(87) PCT Pub. No.: WO2017/013924
PCT Pub. Date: Jan. 26, 2017

(65) Prior Publication Data
US 2018/0219039 A1 Aug. 2, 2018

(30) Foreign Application Priority Data
Jul. 22, 2015 (JP) .................. 2015-144594

(51) Int. Cl.
*H01L 27/146* (2006.01)
*H01L 31/10* (2006.01)
(Continued)

(52) U.S. Cl.
CPC .. *H01L 27/14621* (2013.01); *H01L 27/14643* (2013.01); *H01L 27/14665* (2013.01);
(Continued)

(58) Field of Classification Search
CPC ......... H01L 27/14621; H01L 27/14643; H01L 27/14665; H01L 27/14694; H01L 31/10; H01L 31/1013; H04N 5/378
See application file for complete search history.

(56) References Cited

U.S. PATENT DOCUMENTS

2002/0195620 A1 12/2002 Tanomura
2011/0180688 A1* 7/2011 Nakahara .......... H01L 21/02425
250/208.1
(Continued)

FOREIGN PATENT DOCUMENTS

JP        S64-59968        3/1989
JP        H02-58878       2/1990
(Continued)

OTHER PUBLICATIONS

International Search Report prepared by the Japan Patent Office dated Jul. 19, 2016, for International Application No. PCT/JP2016/063675.

*Primary Examiner* — Allan R Wilson
(74) *Attorney, Agent, or Firm* — Sheridan Ross P.C.

(57) ABSTRACT

An imaging device includes a plurality of light-receiving elements arranged in a two-dimensional matrix shape. Each of the light-receiving elements includes a first electrode, a photoelectric conversion layer, and a second electrode. The photoelectric conversion layer has a laminated structure in which a first compound semiconductor layer having a first conductivity type and a second compound semiconductor layer having a second conductivity type that is a reverse conductivity type to the first conductivity type are laminated from a side of the first electrode. The second compound semiconductor layer has been removed in a reg between the light-receiving elements. The first electrode and the first compound semiconductor layer are shared by the light-receiving elements. An impurity concentration of a first compound semiconductor layer near the first electrode is lower than that of a first compound semiconductor layer near the second compound semiconductor layer.

12 Claims, 27 Drawing Sheets

(51) Int. Cl.
*H01L 31/101* (2006.01)
*H04N 5/378* (2011.01)

(52) U.S. Cl.
CPC ........ *H01L 27/14694* (2013.01); *H01L 31/10* (2013.01); *H01L 31/1013* (2013.01); *H04N 5/378* (2013.01)

(56) References Cited

U.S. PATENT DOCUMENTS

| | | | | |
|---|---|---|---|---|
| 2011/0205412 A1* | 8/2011 | Miyazaki | ......... | H01L 27/14621 348/294 |
| 2013/0043372 A1* | 2/2013 | Wehner | ............ | H01L 27/14647 250/208.1 |
| 2014/0021575 A1* | 1/2014 | Ishihara | ............ | H01L 27/14634 257/440 |
| 2015/0048473 A1* | 2/2015 | Takahashi | ........... | H01L 27/1461 257/443 |
| 2015/0228685 A1 | 8/2015 | Uchida | | |
| 2016/0087000 A1* | 3/2016 | Inada | ............... | H01L 27/14652 250/338.4 |

FOREIGN PATENT DOCUMENTS

| | | |
|---|---|---|
| JP | H06-326118 | 11/1994 |
| JP | 2001-144278 | 5/2001 |
| JP | 2003-007840 | 1/2003 |
| JP | 2012-216727 | 11/2012 |
| JP | 2015-126122 | 7/2015 |
| JP | 2015-149422 | 8/2015 |

* cited by examiner

FIG. 9A

| 101 | 101 | 101 | 101 |
|-----|-----|-----|-----|
| 101 | 101 | 101 | 101 |
| 101 | 101 | 101 | 101 |
| 101 | 101 | 101 | 101 |

FIG. 9B

| 101W | 102 | 101W | 102 |
|------|-----|------|-----|
| 101W | 102 | 101W | 102 |
| 101W | 102 | 101W | 102 |
| 101W | 102 | 101W | 102 |

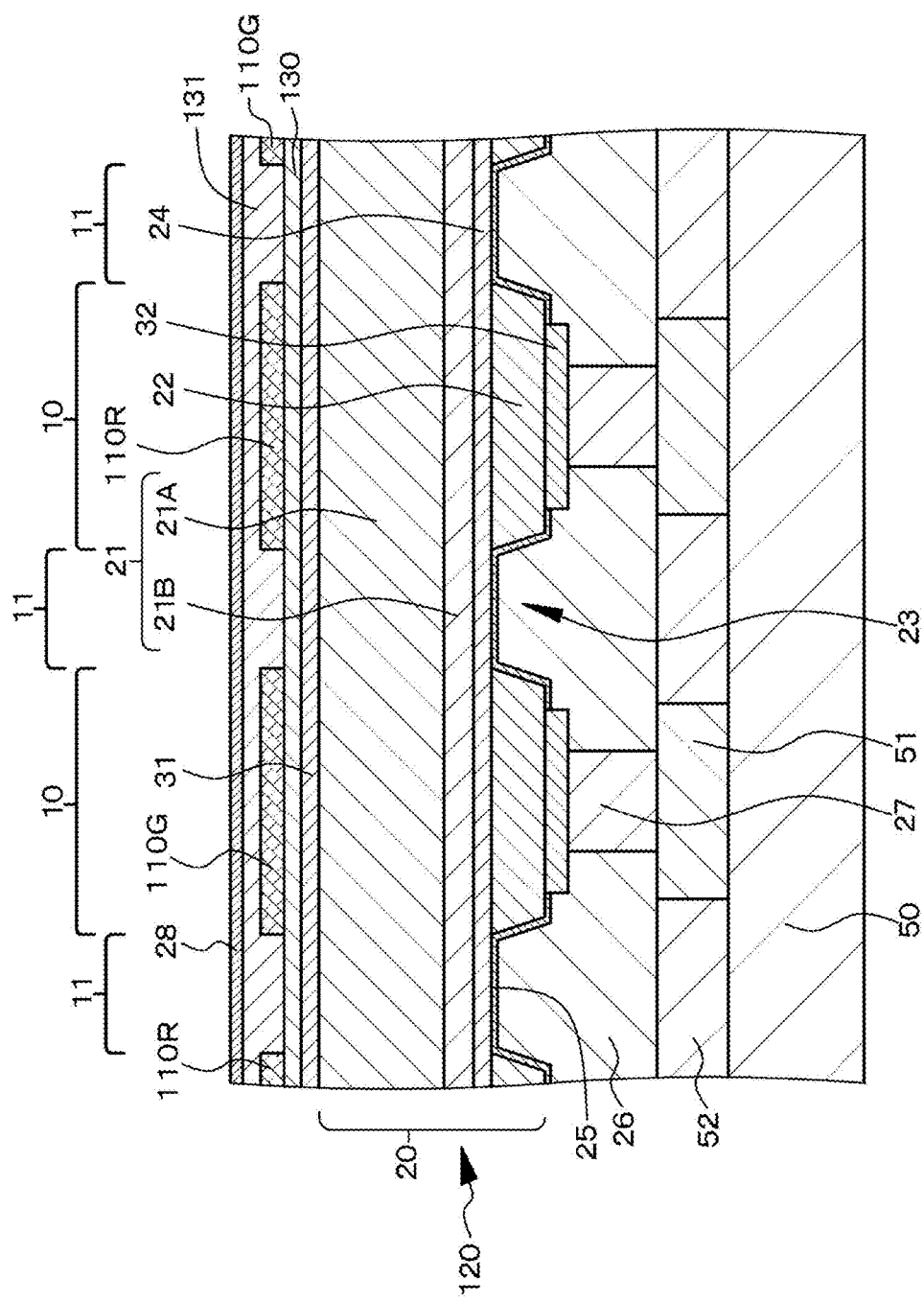

IMAGING DEVICE AND METHOD FOR MANUFACTURING THE SAME

CROSS REFERENCE TO RELATED APPLICATIONS

This application is a national stage application under 35 U.S.C. 371 and claims the benefit of PCT Application No. PCT/JP2016/063675 having an international filing date of 6 May 2016, which designated the United States, which PCT application claimed the benefit of Japan Patent Application No. 2015-144594 filed 22 Jul. 2015, the disclosure of each of which are incorporated herein by reference.

TECHNICAL FIELD

The present disclosure relates to an imaging device and a method for manufacturing the imaging device.

BACKGROUND ART

An imaging device usually includes a light-receiving element (photoelectric conversion element or photodiode) formed on a silicon semiconductor substrate. By the way, if a wavelength of incident light is determined, an optical absorption coefficient of silicon (Si) is uniquely determined. Therefore, in order to cause a silicon semiconductor substrate to efficiently absorb light, particularly light in a red to near infrared region, it is necessary to form a light-receiving element in a region of the silicon semiconductor substrate located at a deep position from a light incident surface (specifically, for example, about 10 µm) (refer to, for example, Japanese Patent Application Laid-open No. 09-331058). This means that micronization of a pixel in an imaging device increases an aspect ratio in the light-receiving element.

However, an increase in aspect ratio in a light-receiving element (imaging element) causes such inter-pixel color mixing that incident light on a light-receiving element (referred to as "light-receiving element-B" for convenience) adjacent to a certain light-receiving element (referred to as "light-receiving element-A" for convenience) is incident on the light-receiving element-A disadvantageously. Reducing an aspect ratio in a light-receiving element in order to reduce inter-pixel color mixing causes a decrease in sensitivity of the light-receiving element in a red to near infrared region disadvantageously. In addition, an energy band gap of Si is 1.1 eV, and therefore it is impossible in principle to detect an infrared ray having a longer wavelength than 1.1 µm. An infrared ray can be detected, for example, using a photoelectric conversion layer having a laminated structure of an InP layer and an InGaAs layer in place of Si.

CITATION LIST

Patent Document

Patent Document 1: Japanese Patent Application Laid-Open No. 09-331058

SUMMARY OF THE INVENTION

Problems to be Solved by the Invention

However, a smaller arrangement pitch of light-receiving elements (imaging elements) causes another kind of inter-pixel color mixing such as entry of carriers generated in the light-receiving element-B into the light-receiving element-A. Technology for preventing such inter-pixel color mixing by forming an element isolation region from an InP layer to a middle of an InGaAs layer constituting a photoelectric conversion layer is well known. The element isolation region includes an impurity region formed on the basis of an impurity solid phase diffusion method or an impurity gas phase diffusion method, or includes a high resistance region formed on the basis of an ion implantation method. However, these formation methods generate many defects in an InP layer or an InGaAs layer near an element isolation region disadvantageously. Micronization of a light-receiving element (pixel) makes it difficult to form an element isolation region on the basis of an impurity solid phase diffusion method or an impurity gas phase diffusion method.

Therefore, an object of the present disclosure is to provide an imaging device having a configuration and a structure making it difficult to generate a defect in a photoelectric conversion layer, and capable of preventing carriers generated in a light-receiving element adjacent to a certain light-receiving element from entering this certain light-receiving element, and a method for manufacturing the imaging device.

Solutions to Problems

An imaging device according to a first or second aspect of the present disclosure for achieving the above object includes a plurality of light-receiving elements arranged in a two-dimensional matrix shape. Each of the light-receiving elements includes a first electrode, a photoelectric conversion layer, and a second electrode. The photoelectric conversion layer has a laminated structure in which a first compound semiconductor layer having a first conductivity type and a second compound semiconductor layer having a second conductivity type that is a reverse conductivity type to the first conductivity type are laminated from a side of the first electrode. The second compound semiconductor layer in a region between the light-receiving elements has been removed. The first electrode and the first compound semiconductor layer are shared by the light-receiving elements.

In addition, in the imaging device according to the first aspect of the present disclosure, an impurity concentration of the first compound semiconductor layer near the first electrode is lower than that of the first compound semiconductor layer near the second compound semiconductor layer. In addition, in the imaging device according to the second aspect of the present disclosure, an element isolation region is formed in the first compound semiconductor layer in a region from which the second compound semiconductor layer has been removed, located between the light-receiving elements.

A method for manufacturing the imaging device according to the first aspect of the present disclosure for achieving the above object includes:

forming, on a film formation substrate, a photoelectric conversion layer having a laminated structure in which a first compound semiconductor layer having a first conductivity type and a second compound semiconductor layer having a second conductivity type that is a reverse conductivity type to the first conductivity type are laminated, and having an impurity concentration of the first compound semiconductor layer near the film formation substrate lower than that of the first compound semiconductor layer near the second compound semiconductor layer;

then forming a second electrode in a region of the second compound semiconductor layer in which a light-receiving element should be formed, and removing the second compound semiconductor layer in a region between the light-receiving elements to obtain a plurality of light-receiving elements arranged in a two-dimensional matrix shape;

then forming an insulating layer on the entire surface, forming an opening in the insulating layer above the second electrode, and filling the opening with a conductive material to form a contact portion connected to the second electrode; and then superposing a driving substrate on which a readout integrated circuit and a connecting portion are formed and the film formation substrate such that the connecting portion and the contact portion are in contact with each other, and joining the connecting portion and the contact portion to each other.

A method for manufacturing the imaging device according to the second aspect of the present disclosure for achieving the above object includes:

forming, on a film formation substrate, a photoelectric conversion layer having a laminated structure in which a first compound semiconductor layer having a first conductivity type and a second compound semiconductor layer having a second conductivity type that is a reverse conductivity type to the first conductivity type are laminated;

then forming a second electrode in a region of the second compound semiconductor layer in which a light-receiving element should be formed, and removing the second compound semiconductor layer in a region between the light-receiving elements;

then forming an element isolation region in the first compound semiconductor layer in a region from which the second compound semiconductor layer has been removed, located between the light-receiving elements, on the basis of an ion implantation method to obtain a plurality of light-receiving elements arranged in a two-dimensional matrix shape;

then forming an insulating layer on the entire surface, forming an opening in the insulating layer above the second electrode, and filling the opening with a conductive material to form a contact portion connected to the second electrode; and then superposing a driving substrate on which a readout integrated circuit and a connecting portion are formed and the film formation substrate such that the connecting portion and the contact portion are in contact with each other, and joining the connecting portion and the contact portion to each other.

Effects of the Invention

In a light-receiving element in the imaging device according to the first aspect of the present disclosure or a light-receiving element obtained by the method for manufacturing the imaging device according to the first aspect of the present disclosure, the second compound semiconductor layer has been removed in a region between the light-receiving elements, and an impurity concentration of the first compound semiconductor layer near the first electrode is lower than that of the first compound semiconductor layer near the second compound semiconductor layer. That is, a gradient is given to the impurity concentration of the first compound semiconductor layer. Therefore, when a reverse bias voltage is applied between the first electrode and the second electrode, in the first compound semiconductor layer in a region from which the second compound semiconductor layer has been removed, located between the light-receiving elements (also referred to as a "second compound semiconductor layer/removed region" for convenience), a region of a potential which carriers (for example, holes) cannot enter is generated. As a result, it is possible to reliably prevent carriers (for example, holes) generated in a light-receiving element (light-receiving element-B) adjacent to a certain light-receiving element (light-receiving element-A) from entering the light-receiving element-A. In addition, an impurity concentration of the first compound semiconductor layer near the first electrode is lower than that of the first compound semiconductor layer near the second compound semiconductor layer. Therefore, a defect is hardly generated in the photoelectric conversion layer, and generation of a dark current can be suppressed. In addition, in prior art, an element isolation region needs to be formed in a part of the second compound semiconductor layer and the first compound semiconductor layer on the basis of an ion implantation method, and a high acceleration voltage is required at the time of ion implantation. Many defects are generated in the second compound semiconductor layer and the first compound semiconductor layer near the element isolation region disadvantageously. However, in a light-receiving element in the imaging device according to the second aspect of the present disclosure or a light-receiving element obtained by the method for manufacturing the imaging device according to the second aspect of the present disclosure, by forming an element isolation region in the first compound semiconductor layer in the second compound semiconductor layer/removed region, it is possible to reliably prevent carriers (for example, holes) generated in the light-receiving element-B from entering the light-receiving element-A. In addition, it is only required to form an element isolation region in a part of the first compound semiconductor layer on the basis of an ion implantation method. Therefore, a high acceleration voltage is not required, and a defect is hardly generated in the photoelectric conversion layer. Note that it is not so difficult to remove the second compound semiconductor layer in a region between the light-receiving elements even if the light-receiving elements (pixels) are micronized. Effects described herein are merely illustrative, and are not restrictive, and an additional effect may be present.

Figure 2A:
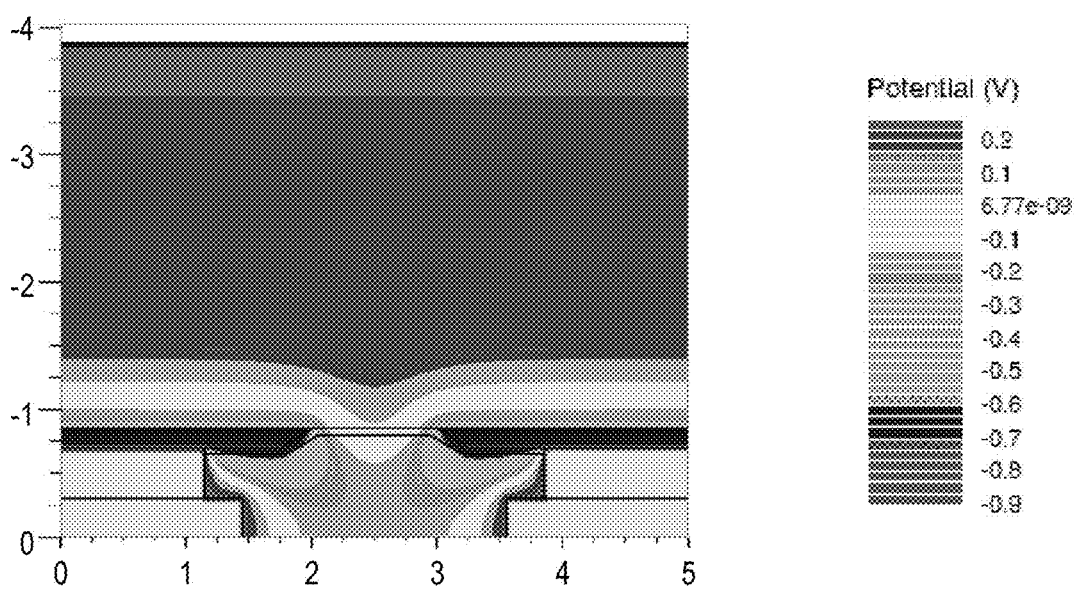
Figure 2B:
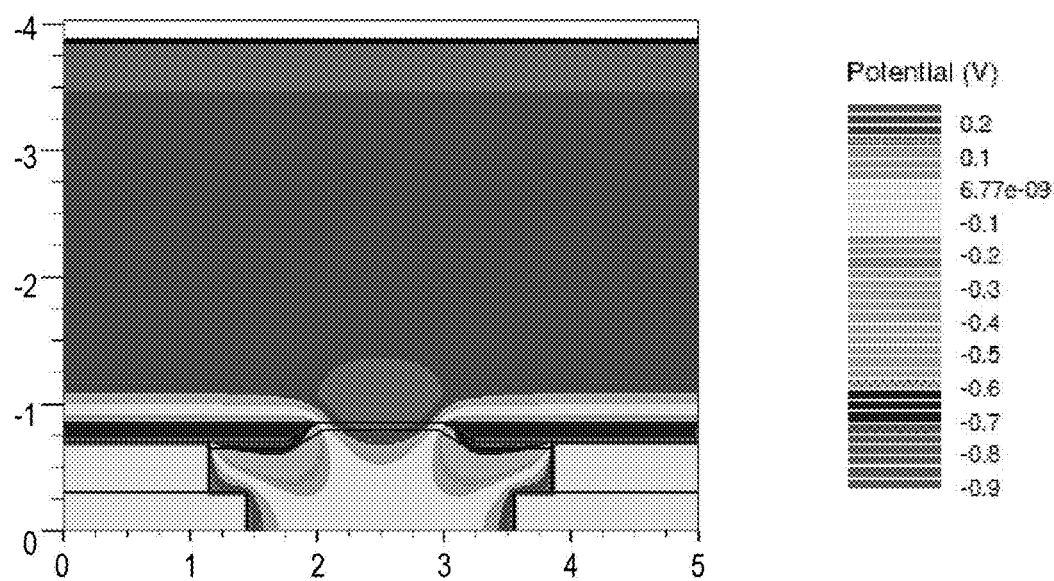

Each of FIGS. 2A and 2B is a diagram illustrating a result of simulation of an electric field potential in the imaging device of Example 1.

Figure 3A:
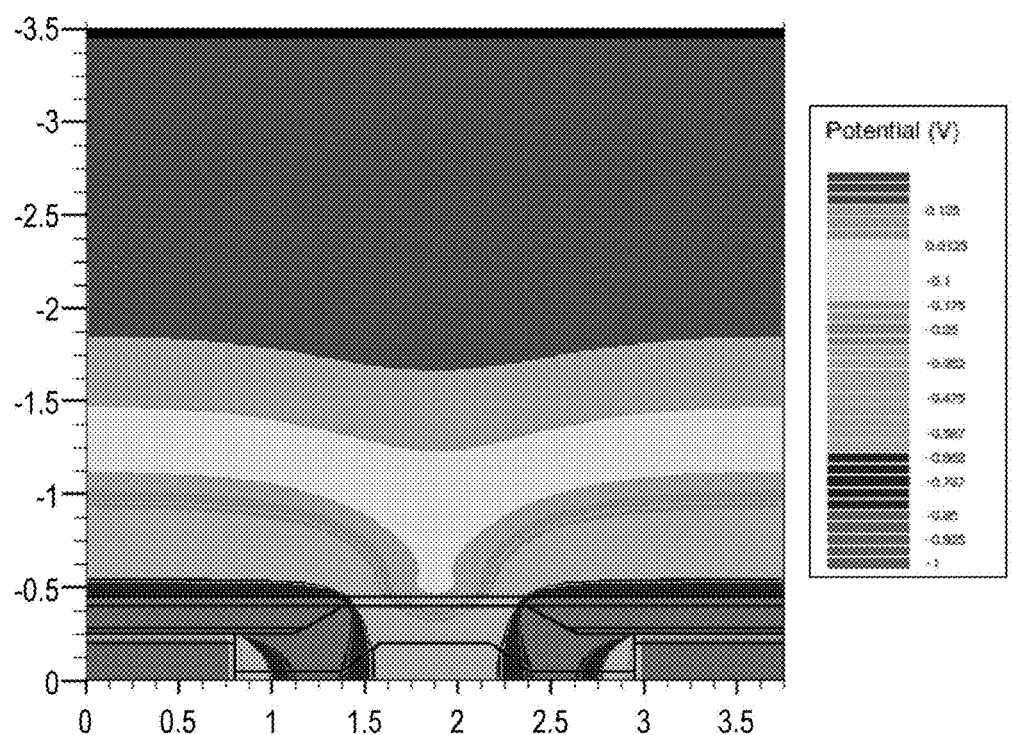
Figure 3B:
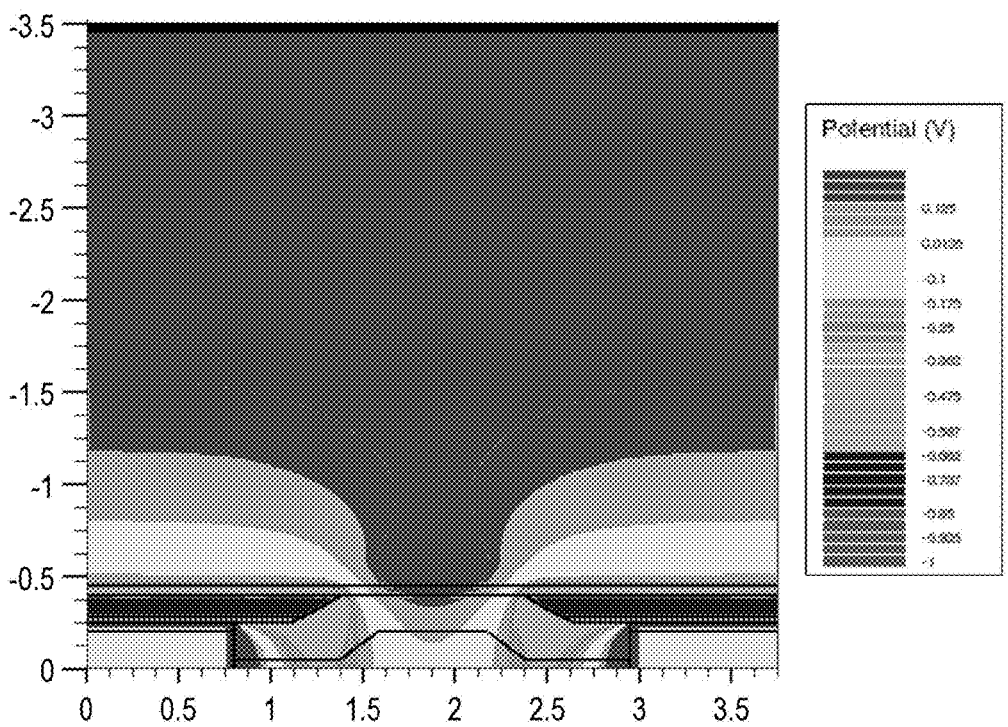

Each of FIGS. 3A and 3B is a diagram illustrating a result of simulation of an electric field potential in the imaging device of Example 1.

Figure 4A:
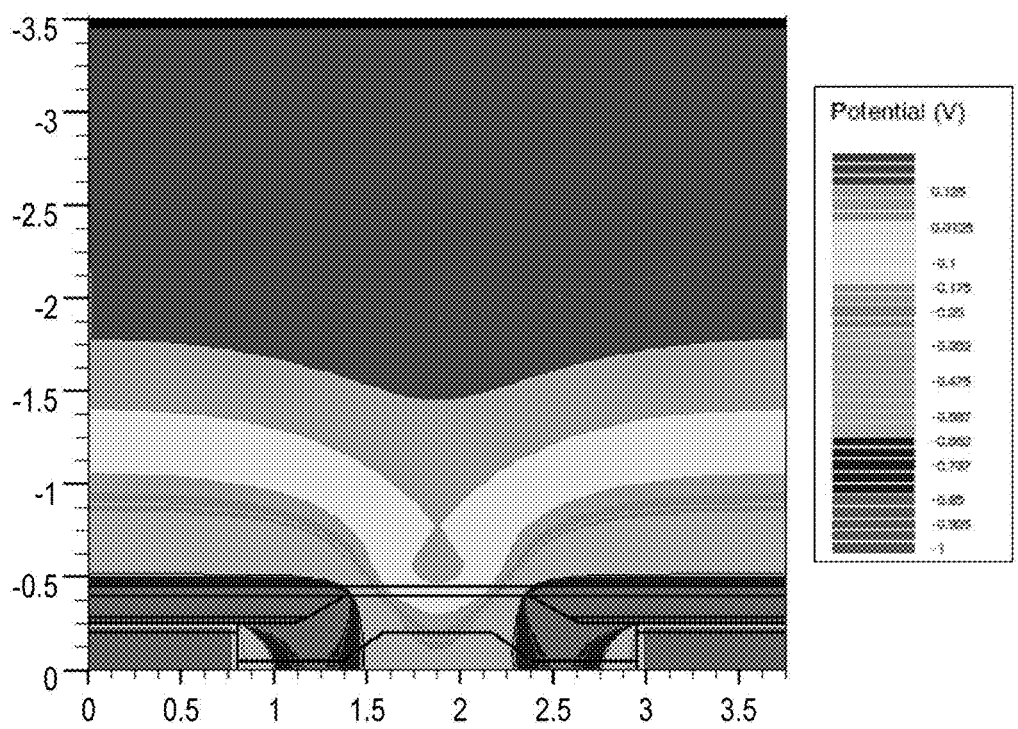
Figure 4B:
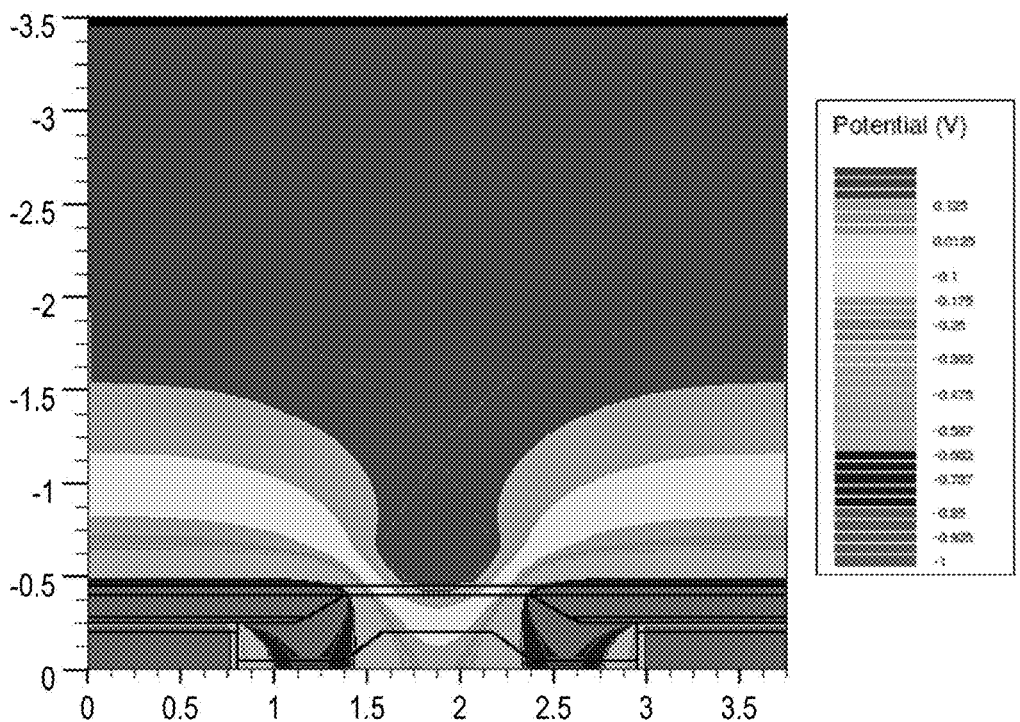

Each of FIGS. 4A and 4B is a diagram illustrating a result of simulation of an electric field potential in the imaging device of Example 1.

Figure 5A:
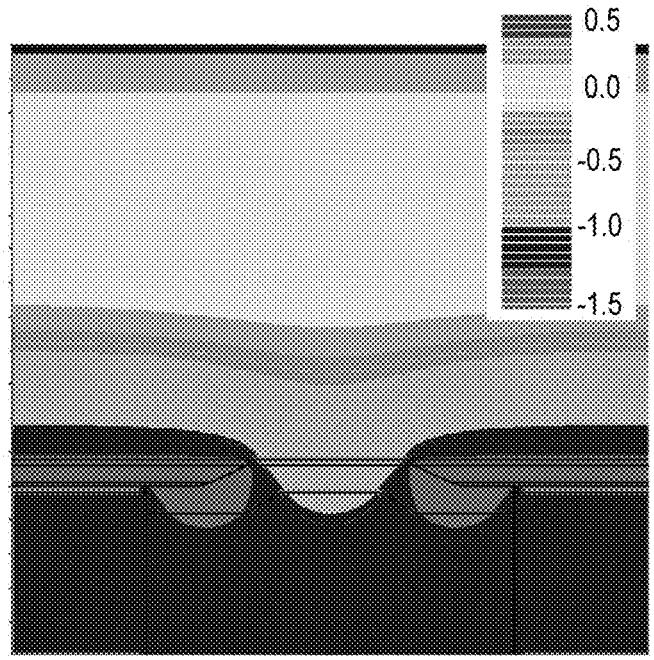
Figure 5B:
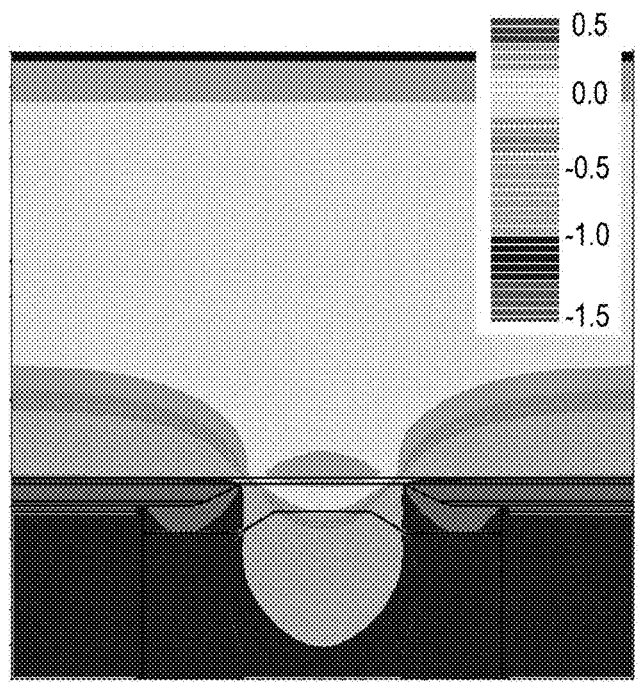

Each of FIGS. 5A and 5B is a diagram illustrating a result of simulation of an electric field potential in the imaging device of Example 1.

Figure 6A:
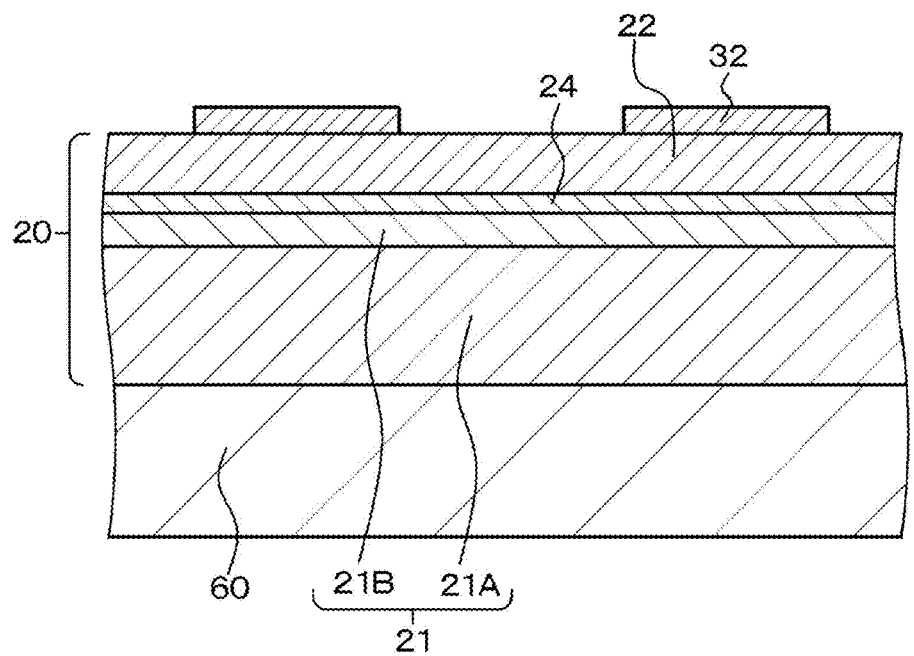
Figure 6B:
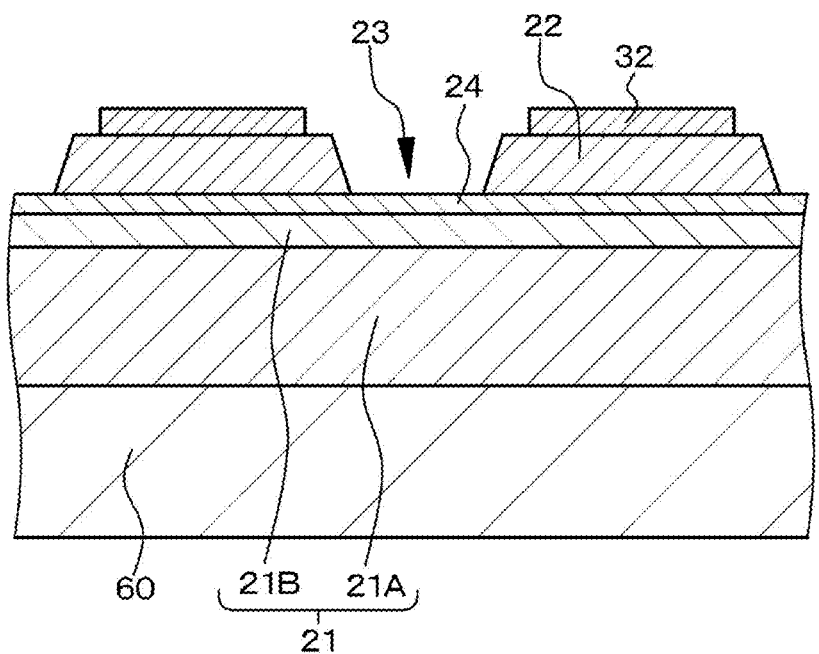

Each of FIGS. 6A and 6B is a schematic partial end view of a photoelectric conversion layer or the like for explaining a method for manufacturing the imaging device of Example 1.

Figure 7:
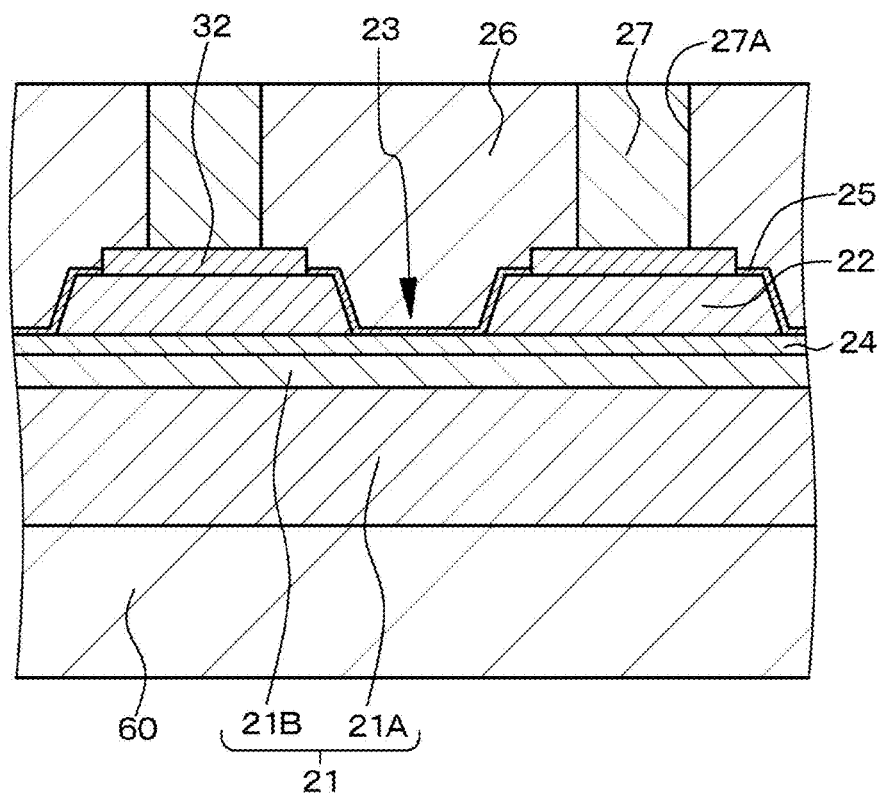

FIG. 7 is a schematic partial end view of a photoelectric conversion layer or the like for explaining a method for manufacturing the imaging device of Example 1, following FIG. 6B.

Figure 8:
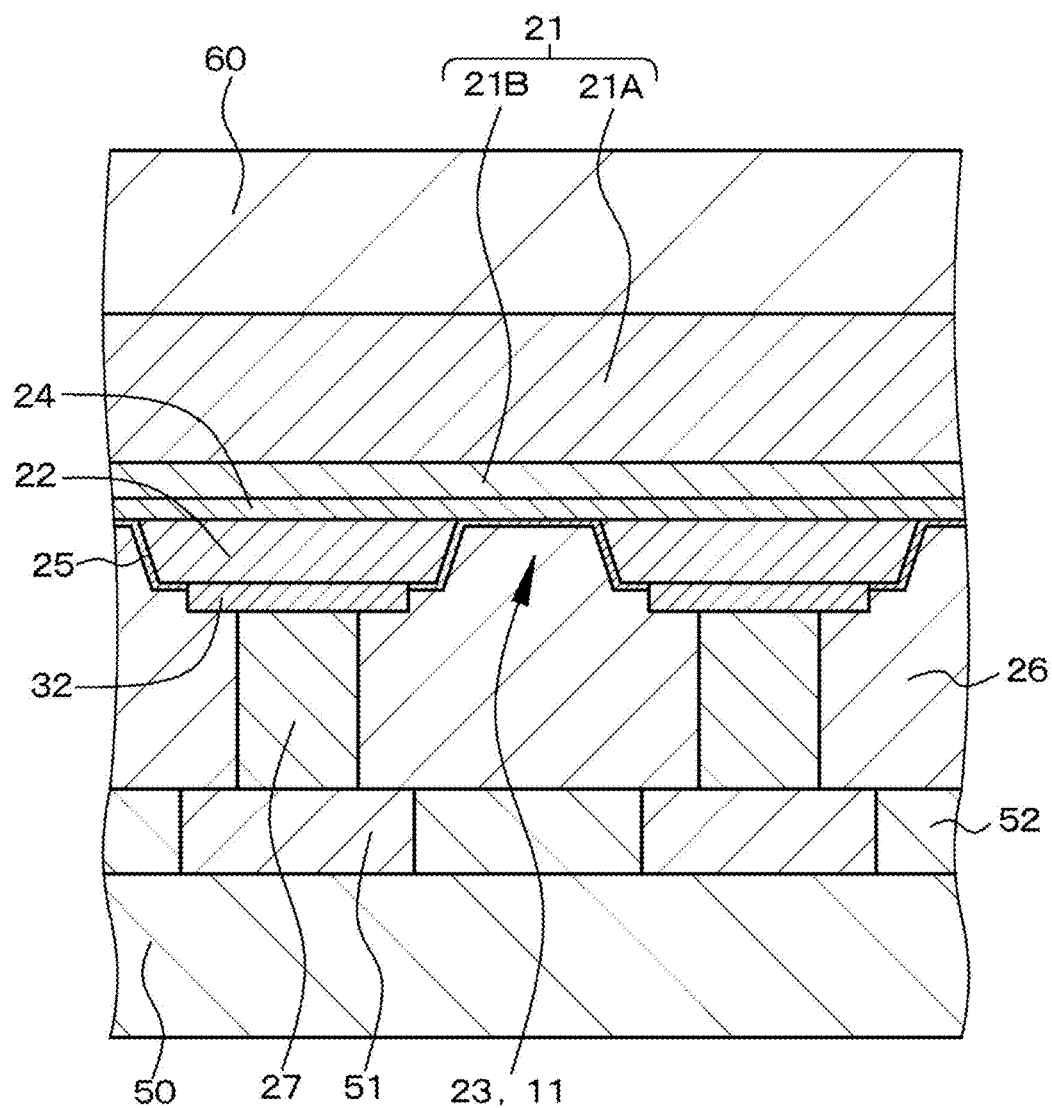

FIG. 8 is a schematic partial end view of a photoelectric conversion layer or the like for explaining a method for manufacturing the imaging device of Example 1, following FIG. 7.

Each of FIGS. 9A and 9B is a diagram schematically illustrating an arrangement of a light-receiving element unit in the imaging device of Example 1.

Figure 10:
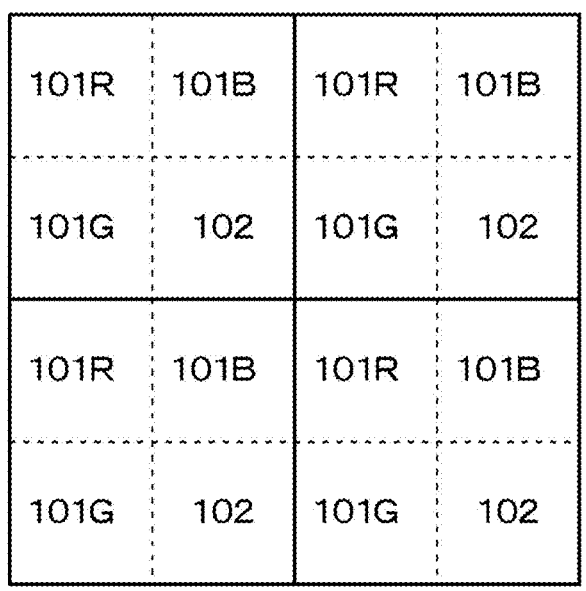

FIG. 10 is a diagram schematically illustrating an arrangement of a light-receiving element unit in the imaging device of Example 1.

Figure 11:
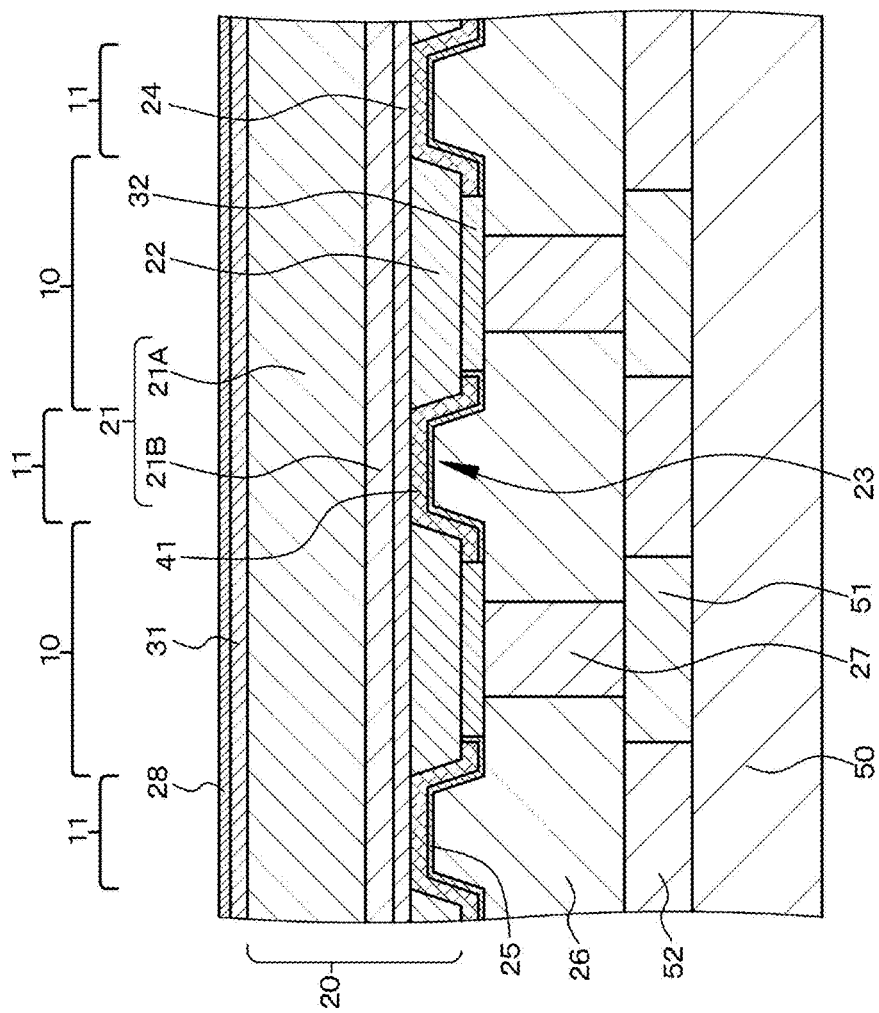

FIG. 11 is a schematic partial end view of an imaging device of Example 2.

Figure 12:
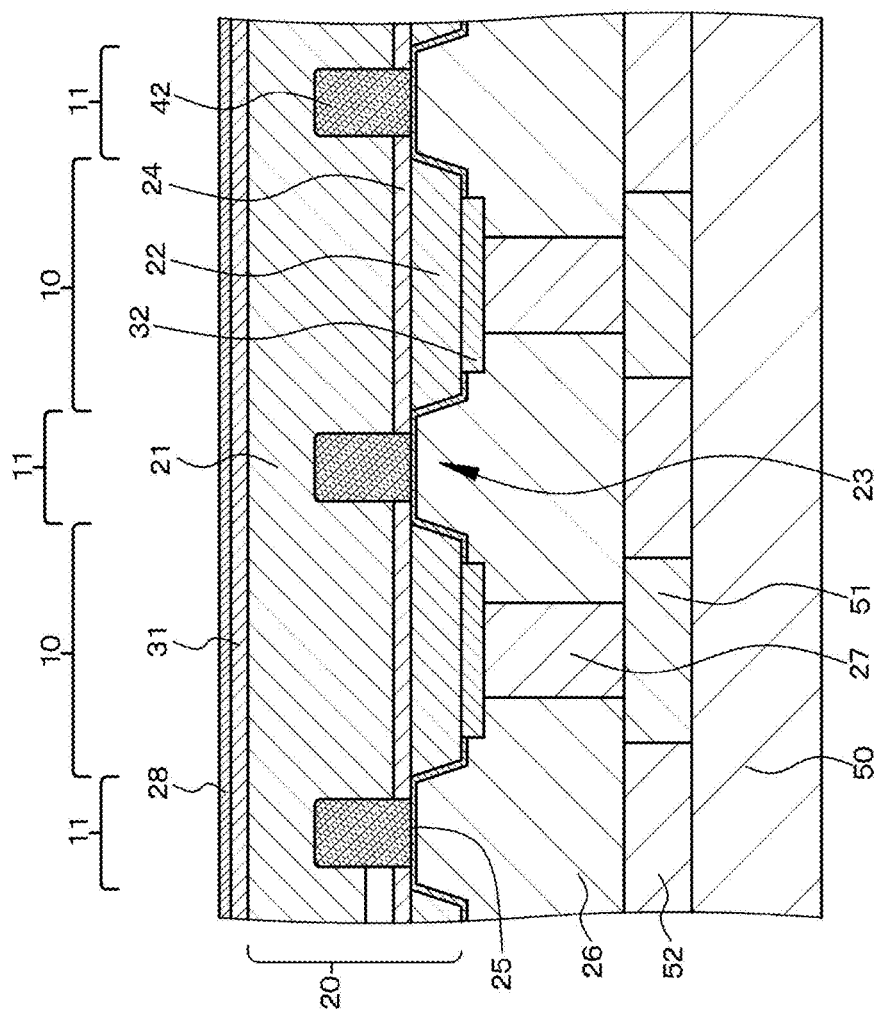

FIG. 12 is a schematic partial end view of an imaging device of Example 3.

Figure 13:
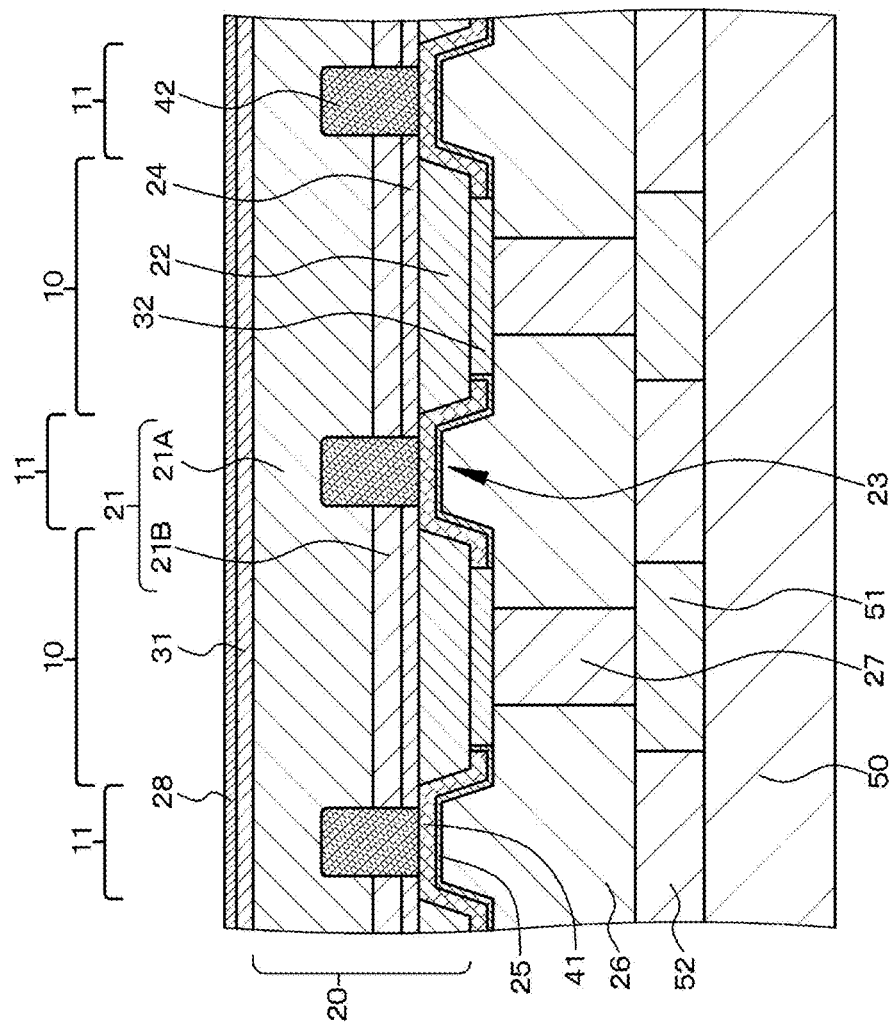

FIG. 13 is a schematic partial end view of a modification example of the imaging device of Example 3.

Figure 14:
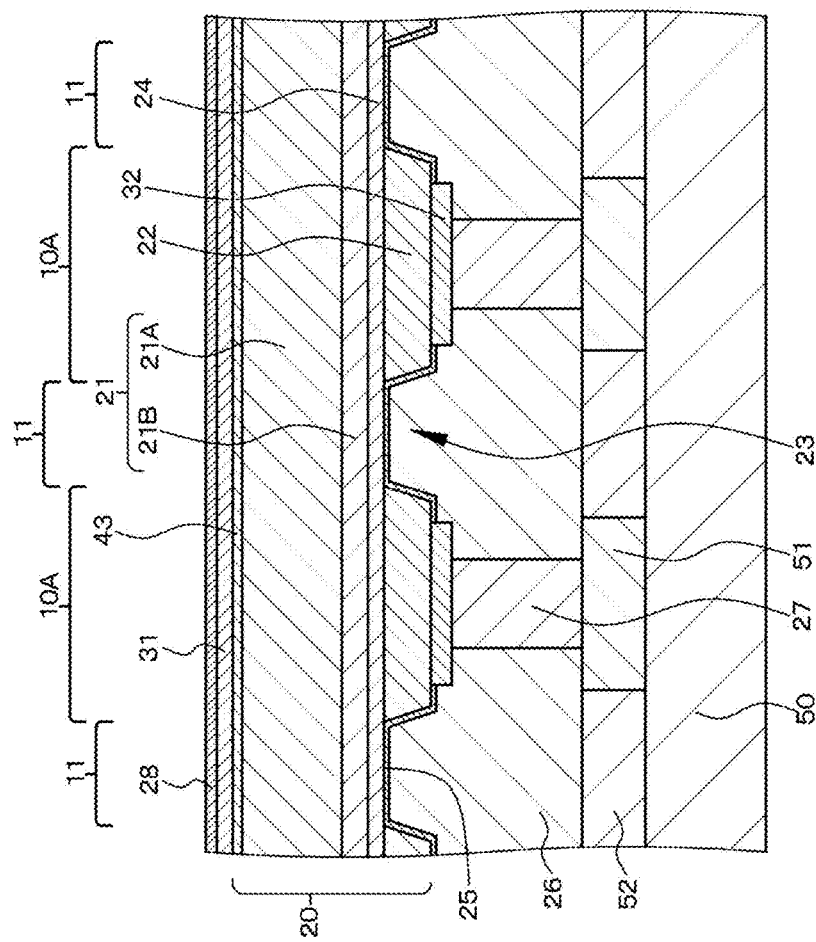

FIG. 14 is a schematic partial cross-sectional view of an imaging device of Example 4.

Figure 15:
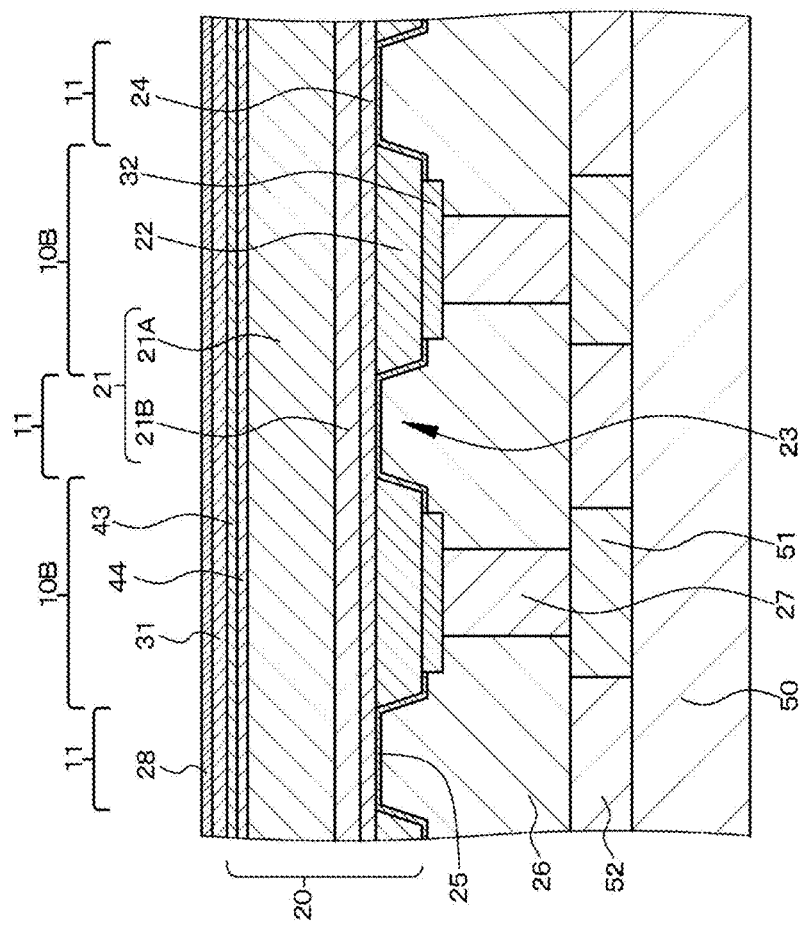

FIG. 15 is a schematic partial cross-sectional view of an imaging device of Example 5.

Figure 16:
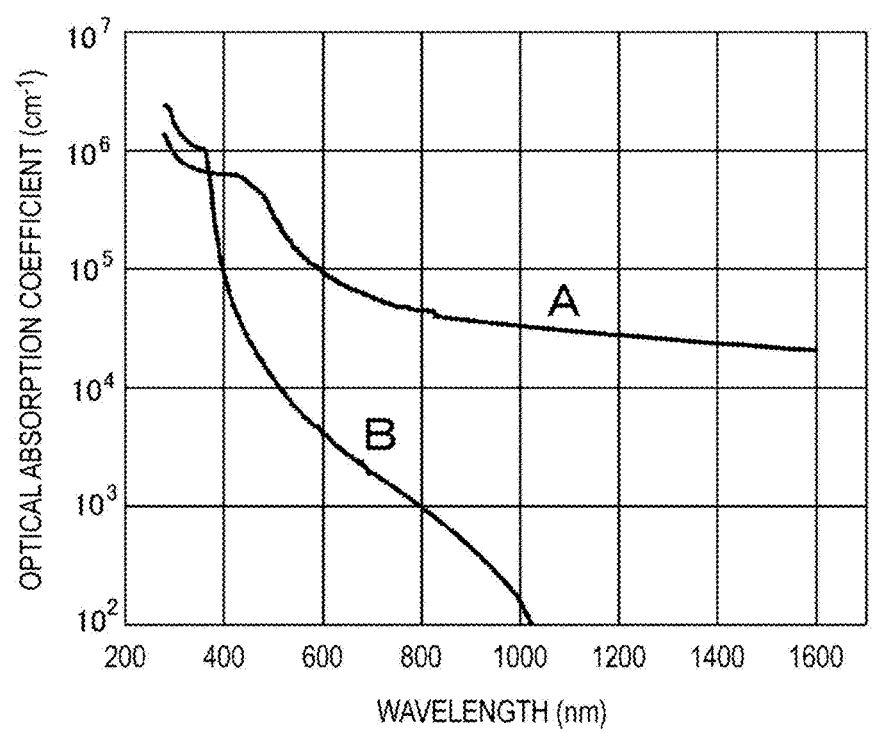

FIG. 16 is a graph illustrating optical absorption coefficients of InGaAs and Si using a wavelength as a parameter.

Figure 17:
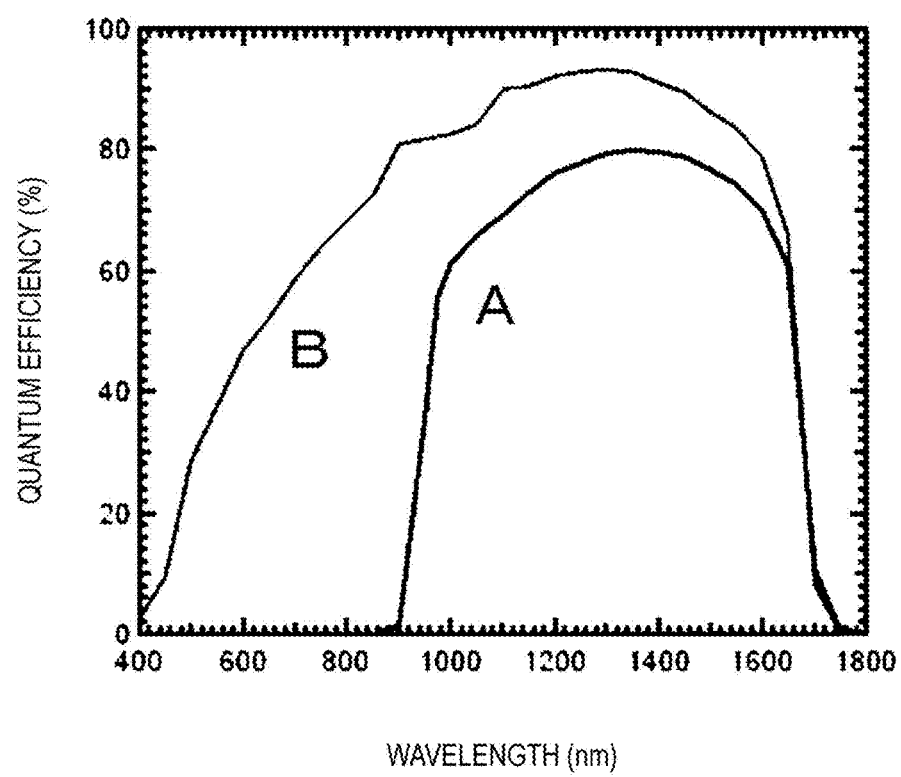

FIG. 17 is a graph illustrating a quantum efficiency of InGaAs in the presence/absence of an InP substrate using a wavelength as a parameter.

Figure 18:
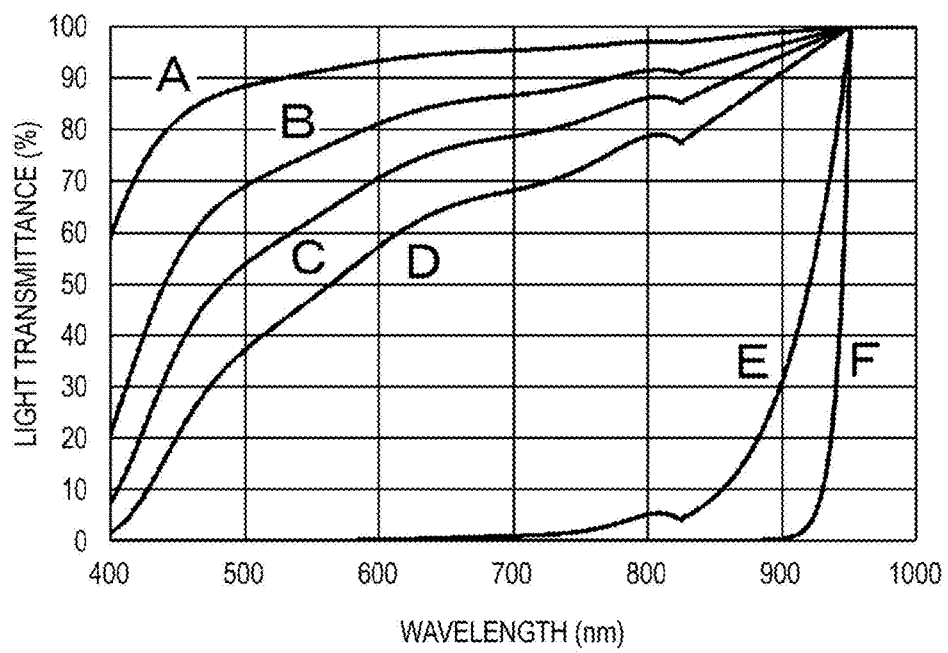

FIG. 18 is a graph illustrating a calculation result of a relationship among the thickness of an InP layer, the wavelength of light incident on the InP layer, and the light transmittance of the InP layer.

Figure 19A:
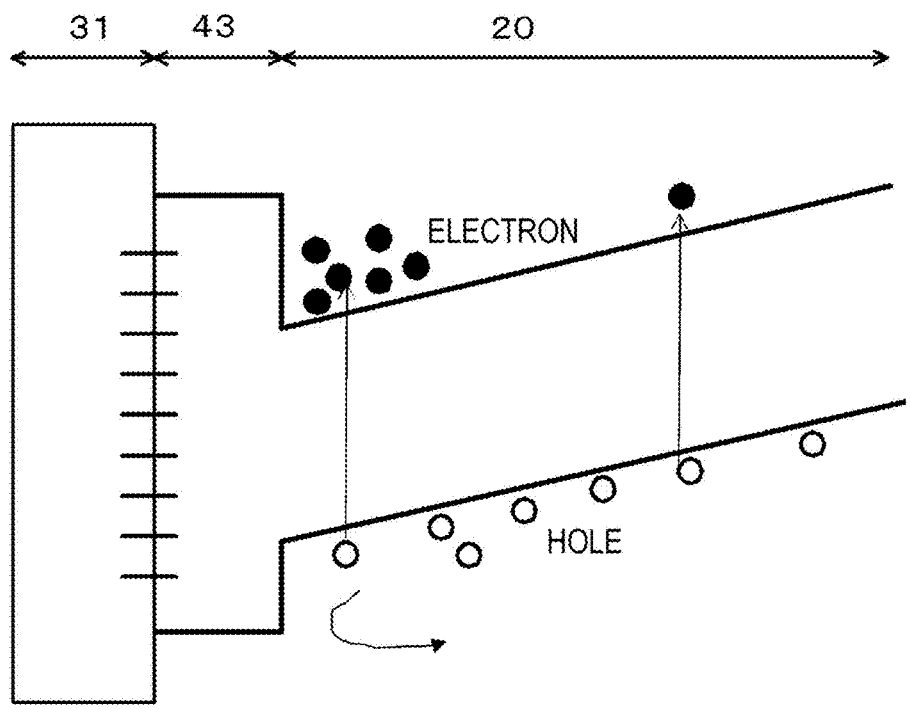
Figure 19B:
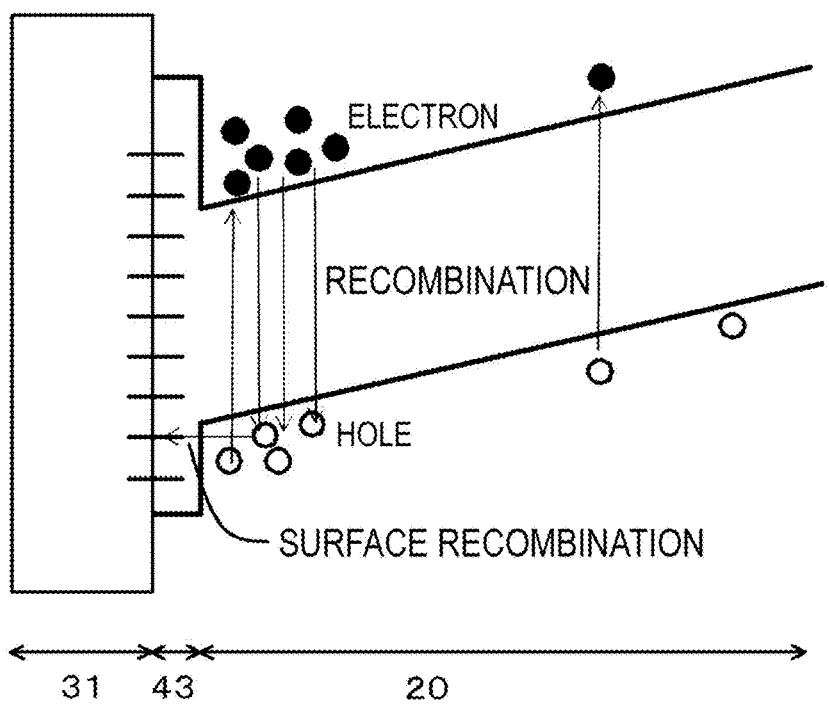

Each of FIGS. 19A and 19B is a conceptual diagram of a band structure in a light-receiving element constituting the imaging device of Example 4.

Figure 20:
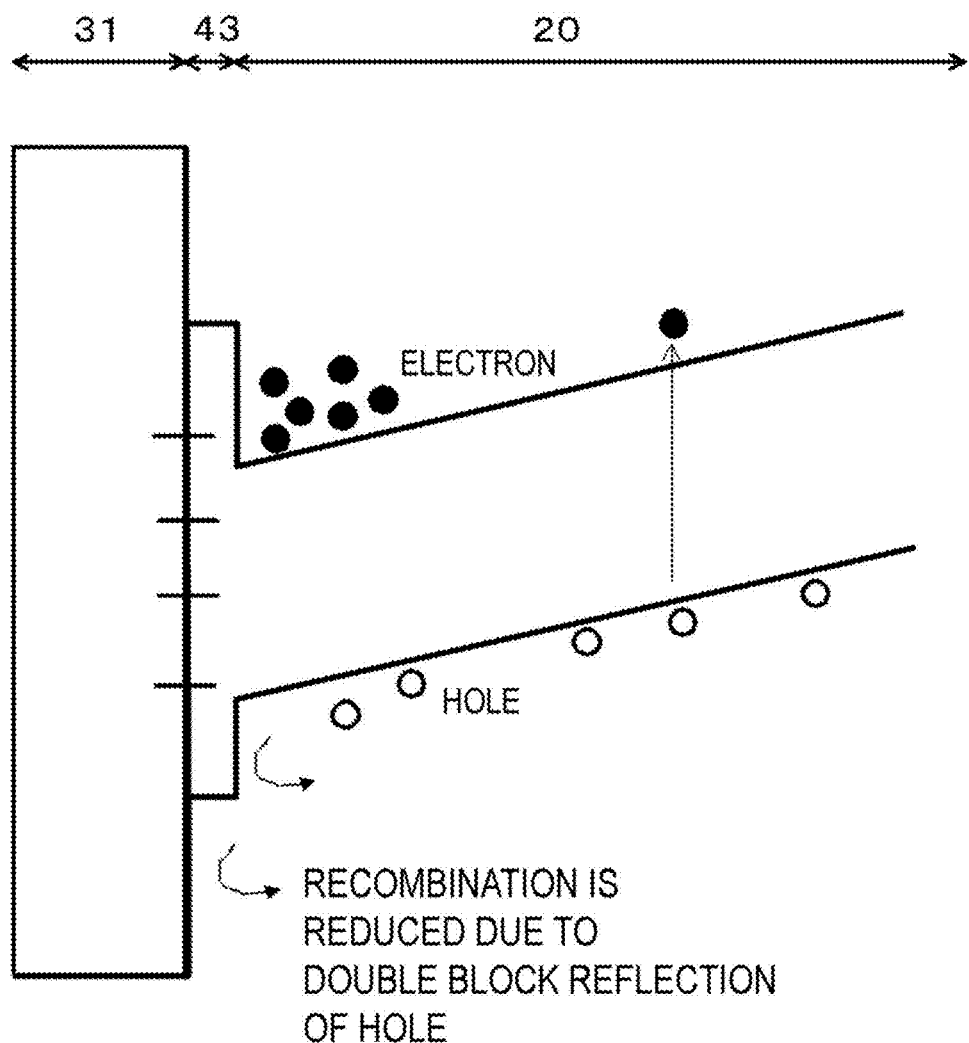

FIG. 20 is a conceptual diagram of a band structure in a light-receiving element constituting the imaging device of Example 4.

Figure 21:
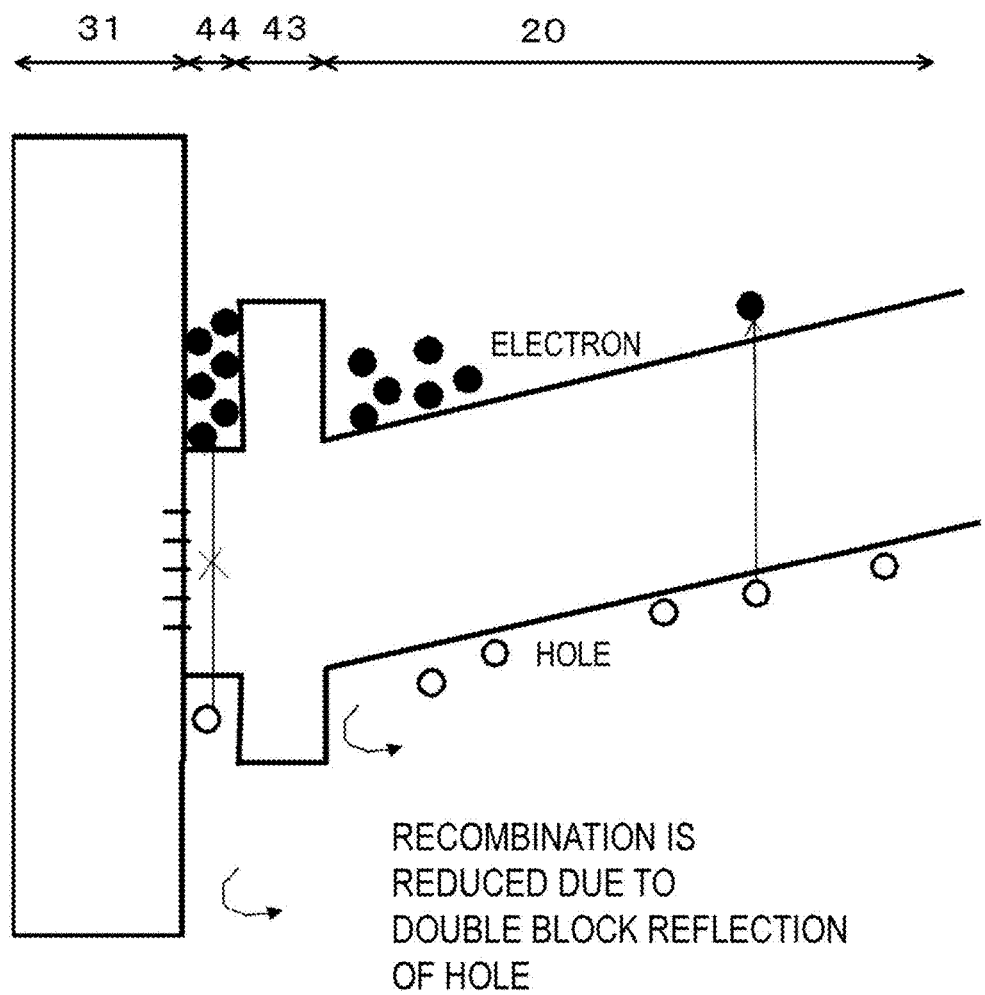

FIG. 21 is a conceptual diagram of a band structure in a light-receiving element constituting the imaging device of Example 5.

Figure 22:
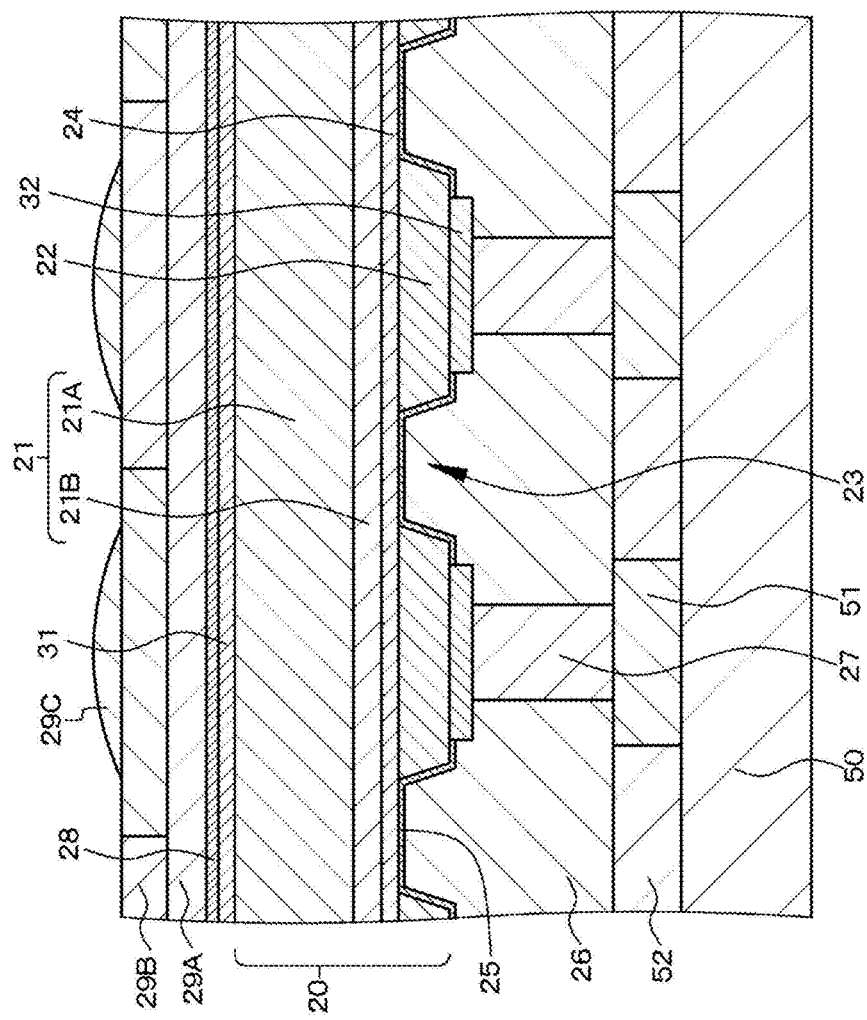

FIG. 22 is a schematic partial cross-sectional view of an imaging device of Example 6.

Figure 23:
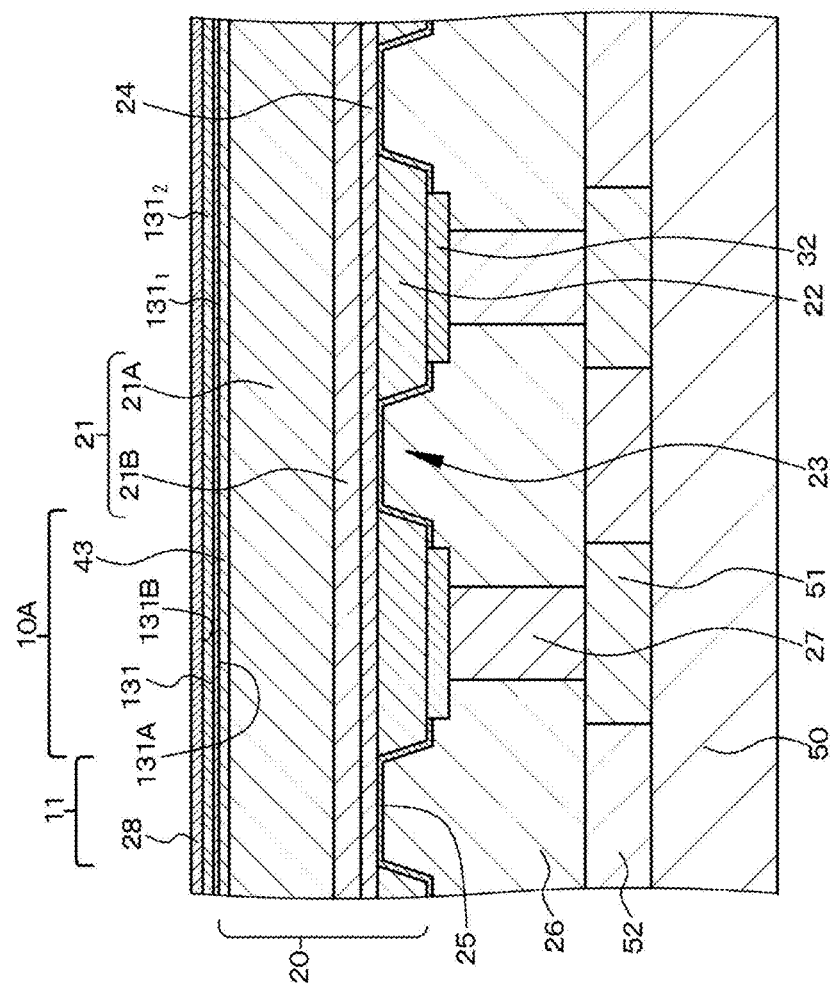

FIG. 23 is a schematic partial cross-sectional view of an imaging device of Example 7.

Figure 24A:
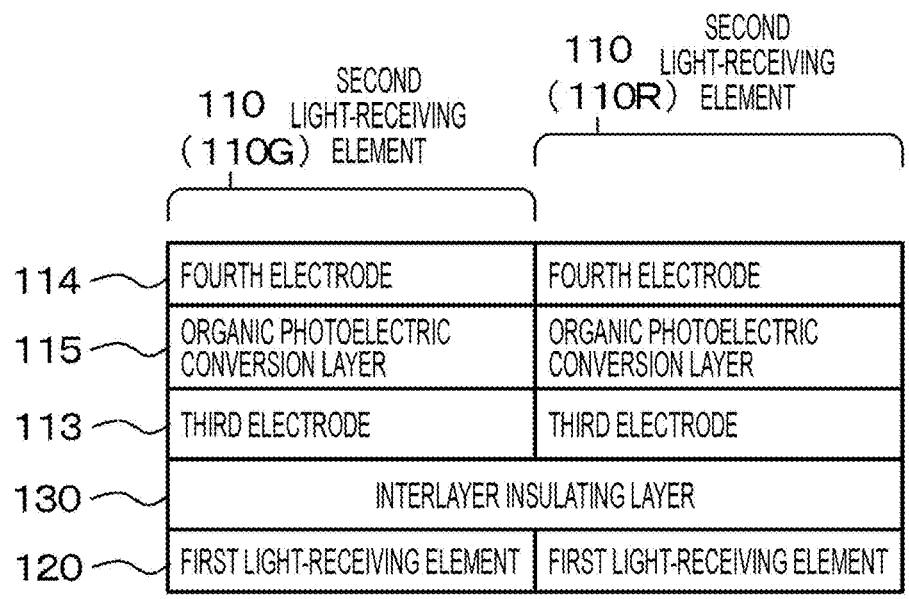
Figure 24B:
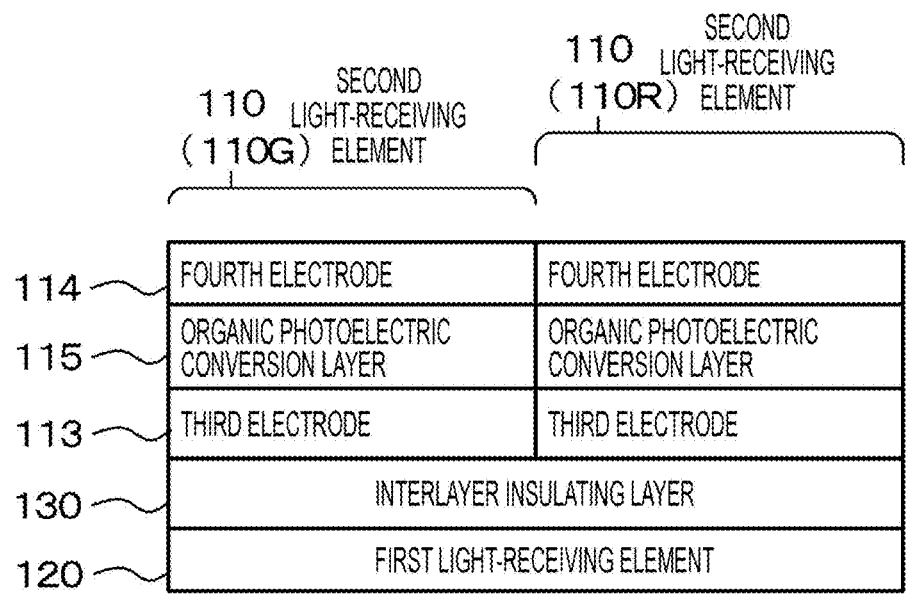

FIGS. 24A and 24B are conceptual diagrams of a lamination type light-receiving element unit of Example 9 and a modification example thereof, respectively.

Figure 25:
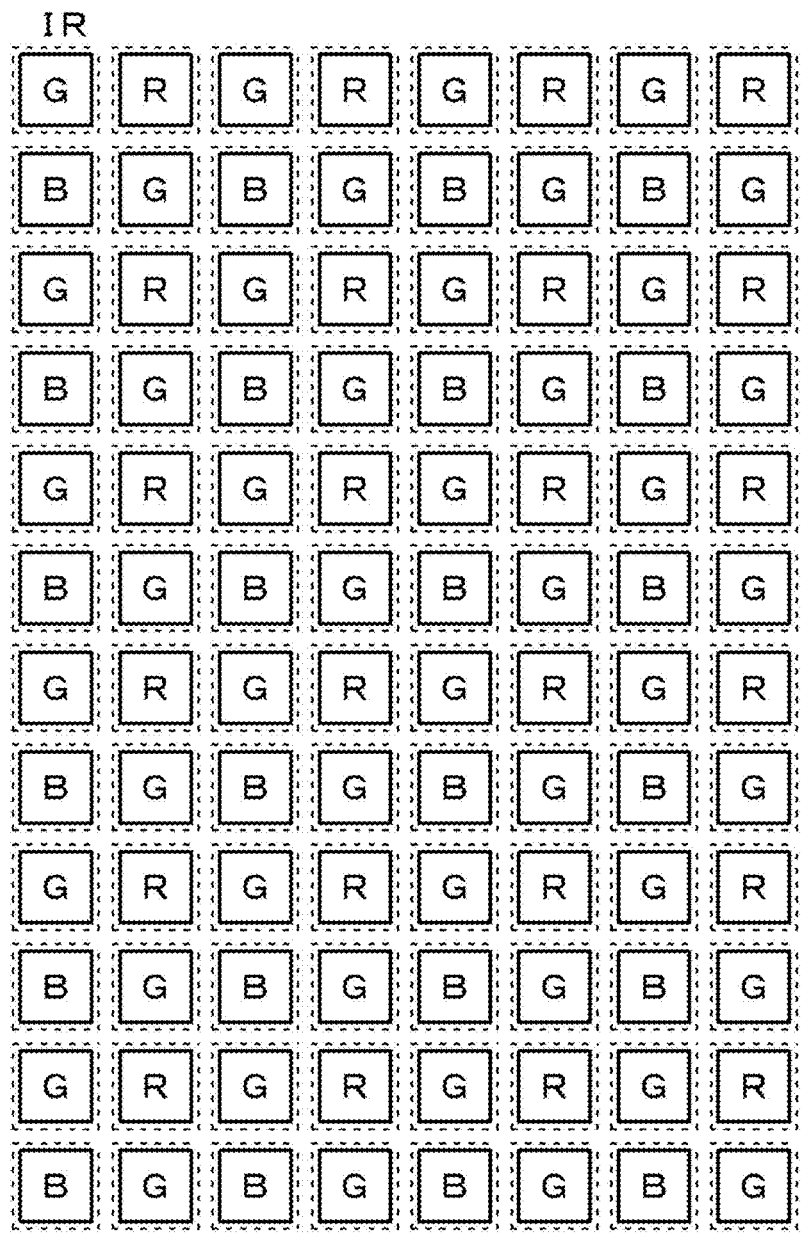

FIG. 25 is a diagram schematically illustrating an arrangement of a first light-receiving element and a second light-receiving element in the lamination type light-receiving element unit of Example 9.

Figure 26:
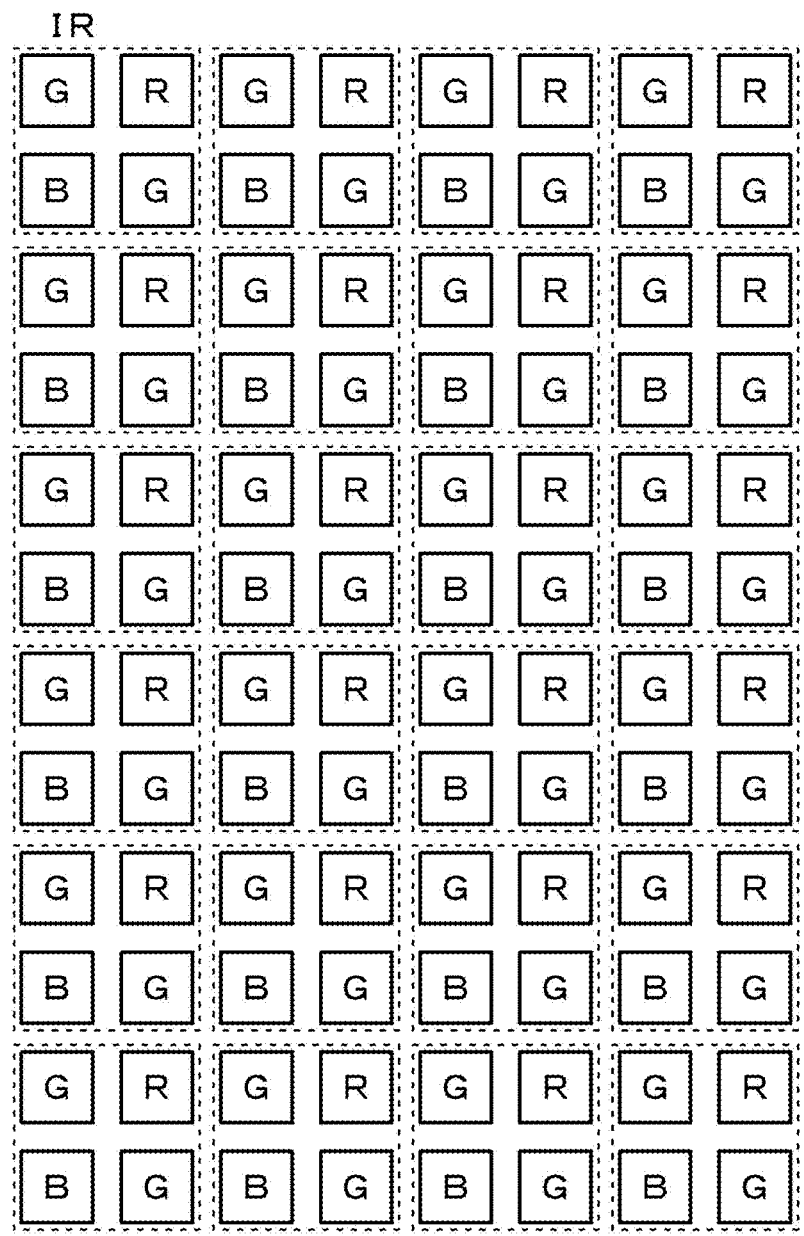

FIG. 26 is a diagram schematically illustrating another arrangement of the first light-receiving element and the second light-receiving element in the lamination type light-receiving element unit of Example 9.

FIG. 27 is a schematic partial end view of an imaging device of Example 9.

MODE FOR CARRYING OUT THE INVENTION

Hereinafter, the present disclosure will be described on the basis of Examples with reference to the drawings. However, the present disclosure is not limited to Examples, but various numerical values and materials in Examples are illustrative. Incidentally, description will be made in the following order.

1. General description of imaging devices according to first and second aspects of the present disclosure, and method for manufacturing the imaging devices 2. Example 1 (imaging device according to the first aspect of the present disclosure and method for manufacturing the imaging device)

3. Example 2 (modification of Example 1)

4. Example 3 (imaging device according to the second aspect of the present disclosure and method for manufacturing the imaging device)

5. Example 4 (modification of Examples 1 to 3)

6. Example 5 (modification of Example 4)

7. Example 6 (modification of Examples 1 to 5)

8. Example 7 (modification of Examples 4 to 6)

9. Example 8 (modification of Example 7)

10. Example 9 (modification of Examples 1 to 8)

11. Others

<General Description of Imaging Devices According to First and Second Aspects of the Present Disclosure, and Method for Manufacturing the Imaging Devices>

In the method for manufacturing the imaging devices according to the first and second aspects of the present disclosure, a contact portion may contain copper (including a copper alloy) and a connection portion may contain copper (including a copper alloy). That is, an opening is filled with a conductive material, and the conductive material contains copper (including a copper alloy). In addition, the method for manufacturing the imaging devices according to the first and second aspects of the present disclosure including this preferable form may further include a step of removing a film formation substrate and forming a first electrode on an exposed first compound semiconductor layer. Furthermore, in the method for manufacturing the imaging devices according to the first and second aspects of the present disclosure including these preferable forms, an etching stop layer may be formed on a film formation substrate, and then a photoelectric conversion layer may be formed on the etching stop layer. This makes it possible to effectively prevent generation of a defect in the photoelectric conversion layer when the film formation substrate is removed.

In the imaging device according to the first aspect of the present disclosure or an imaging device manufactured by the method for manufacturing the imaging device according to the first aspect of the present disclosure including the above various preferable forms (hereinafter, these imaging devices may be also collectively referred to as "the imaging device or the like according to the first aspect of the present disclosure"), the first compound semiconductor layer may have a two-layer structure of a first layer located on a side of the first electrode and having a low impurity concentration and a second layer located on a side of the second compound semiconductor layer and having a high impurity concentration. Furthermore, the impurity concentration in the first layer of the first compound semiconductor layer may be $1\times10^{14}$ cm$^{-3}$ to $5\times10^{15}$ cm$^{-3}$ and the impurity concentration in the second layer of the first compound semiconductor layer may be $5\times10^{15}$ cm$^{-3}$ to $1\times10^{18}$ cm$^{-3}$. Furthermore, the second layer of the first compound semiconductor layer may be thinner than the first layer of the first compound semiconductor layer. The first compound semiconductor layer may be constituted by three or more layers or may have a configuration in which the impurity concentration changes gradually or stepwise.

In addition, in the imaging device or the like according to the first aspect of the present disclosure including the above-described various preferable forms, an element isolation region including a high resistance region may be formed in the first compound semiconductor layer in the second compound semiconductor layer/removed region. In addition, in the imaging device according to the second aspect of the present disclosure or an imaging device manufactured by the method for manufacturing the imaging device according to the second aspect of the present disclosure including a preferable form, the element isolation region may include a high resistance region.

Furthermore, in the imaging device or the like according to the first aspect of the present disclosure including the above-described various preferable forms, or the imaging device according to the second aspect of the present disclosure including the above-described preferable form or an imaging device manufactured by the method for manufacturing the imaging device according to the second aspect of the present disclosure including the preferable form (hereinafter, these imaging devices may be also collectively referred to as "the imaging device or the like of the present disclosure"), an undoped third compound semiconductor layer may be formed in the second compound semiconductor layer/removed region. By formation of the undoped third compound semiconductor layer, generation of a dark current can be further suppressed. The third compound semiconductor layer may extend onto the second compound semiconductor layer. Examples of a compound semiconductor constituting the third compound semiconductor layer include InP.

Furthermore, in the imaging device or the like of the present disclosure including the above-described various preferable forms, the first compound semiconductor layer may include an n-InGaAs layer and the second compound semiconductor layer may include a p-InP layer. However, a compound semiconductor constituting the second compound semiconductor layer is not limited to InP, but can be InGaAsP or AlInAs. In addition, in this case, a p-AlInAs layer may be formed between the first compound semiconductor layer and the second compound semiconductor layer, and the p-AlInAs layer may extend to the second compound semiconductor layer/removed region. This makes it possible to reliably prevent generation of damage in the first compound semiconductor layer when the second compound semiconductor layer in a region between light-receiving elements is removed. That is, the p-AlInAs layer functions as an etching stop layer when the second compound semiconductor layer is removed in a region between the light-receiving elements on the basis of an etching method.

Furthermore, in the imaging device or the like of the present disclosure including the above-described various preferable forms, an arrangement pitch of the light-receiving elements may be 5 μm or less.

The first compound semiconductor layer may be regarded as an i layer depending on the impurity concentration contained in the first compound semiconductor layer. That is, the first compound semiconductor layer having the first conductivity type also includes an intrinsic semiconductor layer. In addition, in this case, a compound semiconductor layer having the first conductivity type and having a higher impurity concentration than that of the first compound semiconductor layer may be formed between the first electrode and the first compound semiconductor layer. Alternatively, a compound semiconductor layer (window layer) having the first conductivity type and having a higher impurity concentration than that of the first compound semiconductor layer may be formed between the first electrode and the first compound semiconductor layer having the first conductivity type. Alternatively, a buffer layer or a contact layer may be formed between the first electrode and the first compound semiconductor layer. A contact layer may be formed between the second electrode and the second compound semiconductor layer.

In the imaging device or the like of the present disclosure including the above-described various preferable forms, a surface recombination preventing layer may be formed between the first electrode and the first compound semiconductor layer in a light-receiving element on which light is incident via the first electrode. Here, the surface recombination preventing layer preferably has a thickness of 30 nm or less. Furthermore, a contact layer including a compound semiconductor and having a thickness of 20 nm or less may be formed between the first electrode and the surface recombination preventing layer.

Examples of a compound semiconductor material constituting the surface recombination preventing layer include InP, InGaAsP, and AlInAs. In addition, examples of a compound semiconductor material constituting the contact layer include InGaAs, InP, and InGaAsP. Here, examples of a combination of (a compound semiconductor constituting the contact layer and a compound semiconductor constituting the surface recombination preventing layer) include (InGaAs, InP), (InGaAs, InGaAsP), (InGaAs, AlInAs), (InP, InGaAsP), (InP, AlInAs), (InGaAsP, InP), (InGaAsP, AlInAs), and (In$_X$GaAsP, In$_Y$GaAsP) [provided that X>Y is satisfied].

In the imaging device or the like of the present disclosure, the first electrode may be constituted by a transparent conductive material. Examples of the transparent conductive material include indium tin oxide (ITO, including Sn-doped In$_2$O$_3$, crystalline ITO, and amorphous ITO), ITiO (Ti-doped In$_2$O$_3$), NiO, and a laminated structure of layers containing these materials. The conductivity type of the transparent conductive material is preferably the same as the conductivity type of a compound semiconductor constituting the first compound semiconductor layer or the surface recombination preventing layer. Alternatively, examples of the transparent conductive material include indium zinc oxide (IZO), aluminum oxide-doped zinc oxide (AZO), gallium-doped zinc oxide (GZO), aluminum oxide and magnesium oxide-doped zinc oxide (AlMgZnO), indium-gallium composite oxide (IGO), In—GaZnO$_4$ (IGZO), F-doped In$_2$O$_3$ (IFO), antimony-doped SnO$_2$ (Ala), F-doped SnO$_2$ (FTC)), tin oxide (SnO$_2$), zinc oxide (ZnO), B-doped ZnO, and InSnZnO.

Alternatively, the first electrode may have a first surface in contact with the surface recombination preventing layer or the contact layer, and a second surface facing the first surface. The first electrode may contain a transparent conductive material, and the transparent conductive material may contain an additive containing at least one metal selected from the group comprising molybdenum, tungsten, chromium, ruthenium, titanium, nickel, zinc, iron, and copper, or a compound thereof. The concentration of an additive contained in the transparent conductive material near an interface of the first surface of the first electrode may be higher than that of the additive contained in the transparent conductive material near the second surface of the first electrode. Specific examples of the additive containing a metal compound constituting the transparent conductive material include tungsten oxide, chromium oxide, ruthenium oxide, titanium oxide, molybdenum oxide, nickel oxide, zinc oxide, iron oxide, and copper oxide. As described above, the transparent conductive material contains an additive. Furthermore, the concentration of the additive contained in the transparent conductive material near an interface of the first surface of the first electrode is higher than that of the additive contained in the transparent conductive material near the second surface of the first electrode. It is thereby possible to provide the first electrode satisfying both a low contact resistance value and a high light transmittance. The concentration of the additive contained in the transparent conductive material near an interface of the first surface of the first electrode is higher than that of the additive contained in the transparent conductive material near the second surface of the first electrode. Here, the region near the interface of the first surface of the first electrode means a region occupying 10% of the thickness of the first electrode from the first surface of the first electrode toward the second surface of the first electrode. The vicinity of the interface of the second surface of the first electrode means a region occupying 10% of the thickness of the first electrode from the second surface of the first electrode toward the first surface of the first electrode. In addition, the concentration of the additive means an average concentration in these regions.

Alternatively, the first electrode may have a configuration in which the first electrode has a laminated structure of a first layer and a second layer from a side of the surface recombination preventing layer or the contact layer, the transparent conductive material constituting the first layer of the first electrode contains an additive, and the transparent conductive material constituting the second layer of the first electrode contains no additive. If an average concentration of an additive contained in the transparent conductive material constituting the first layer of the first electrode is represented by $Ic_1$ and an average concentration of an additive contained in the transparent conductive material constituting the second layer of the first electrode is represented by $Ic_2$, $5 \leq Ic_1/Ic_2 \leq 10$ is preferably satisfied. Whether the transparent conductive material contains an additive can be evaluated using SIMS. Here, in a case where a carrier concentration of one metal (specifically, for example, molybdenum) is $1.8 \times 10^{16}$ cm$^{-3}$ or more, it can be judged that the transparent conductive material contains an additive. Meanwhile, in a case where a carrier concentration of one metal (specifically, for example, molybdenum) is less than $1.8 \times 10^{16}$ cm$^{-3}$, it can be judged that the transparent conductive material contains no additive.

In addition, the average concentration of an additive contained in the transparent conductive material constituting the first layer of the first electrode is preferably $5 \times 10^{16}$ cm$^{-3}$ to $1 \times 10^{18}$ cm$^{-3}$. In the first electrode having such a preferable configuration, if an electric resistivity of the first layer of the first electrode is represented by $R_1$, an electric resistivity of the second layer of the first electrode is represented by $R_2$, a light transmittance of the first layer of the first electrode, for example, at a wavelength of 400 nm to 900 nm is represented by $TP_1$, and a light transmittance of the second layer of the first electrode is represented by $TP_2$, $0.4 \leq R_2/R_1 \leq 1.0$ and $0.80 \leq TP_2 \times TP_1 \leq 1.0$ are preferably satisfied. Furthermore, an average light transmittance of the first electrode is preferably 95% or more, an average electric resistivity of the first electrode is preferably $2 \times 10^{-6}$ Ω·m ($2 \times 10^{-4}$ Ω·cm) or less, and a contact resistance value between the first electrode and the surface recombination preventing layer or the contact layer is preferably $1 \times 10^{-8}$ Ω·m$^2$ ($1 \times 10^{-4}$ Ω·cm$^2$) or less. In addition, if the thickness of the first layer of the first electrode is represented by $T_1$ and the thickness of the second layer of the first electrode is represented by $T_2$, $2 \leq T_2/T_1 \leq 70$ is preferably satisfied. In this case, $3 \leq T_1$ (nm) $\leq 60$ and $10 \leq T_2$ (nm) $\leq 350$ are more preferably satisfied. Here, an average concentration of an additive contained in the transparent conductive material constituting the first layer of the first electrode can be measured using SIMS. In addition, the electric resistivity of the first layer of the first electrode, the electric resistivity of the second layer of the first electrode, and the average electric resistivity of the first electrode can be measured, for example, on the basis of a method for sticking a surface of a light-receiving element to a holding substrate such as a glass substrate, peeling a back side of the light-receiving element, and then subjecting the remaining first electrode to hole measurement with a sheet resistance measuring machine. The contact resistance value between the first electrode and the contact layer can be measured, for example, on the basis of a method for sticking a surface of a light-receiving element to a holding substrate such as a glass substrate, forming a TLM pattern with only the contact layer remaining when the back side of the light-receiving element is peeled, and then performing a four-terminal measurement method. Furthermore, the light transmittance (light absorptivity) of the first layer of the first electrode, the light transmittance (light absorptivity) of the second layer of the first electrode, the average light transmittance (light absorptivity) of the first electrode can be measured by sticking a surface of a light-receiving element to a glass substrate using a transmission and reflectance measuring machine. In addition, the thickness of the first layer of the first electrode and the thickness of the second layer of the first electrode can be measured using a step gauge or on the basis of SEM or TEM electron microscope observation.

Alternatively, the concentration of an additive contained in the transparent conductive material constituting the first electrode may gradually decrease from the first surface of the first electrode toward the second surface thereof. The concentration of an additive contained in the transparent conductive material can be measured using SIMS.

The first electrode is a so-called solid film. In addition, the first electrode can be formed basically on the basis of a sputtering method. In order to cause the transparent conductive material constituting the first electrode to contain an additive, specifically, for example, a target constituted by the transparent conductive material (referred to as a "transparent conductive material target") and a target constituted by the additive (referred to as an "additive target") are disposed in a sputtering apparatus. Then, it is only required to perform sputtering using the additive target to attach the additive to the transparent conductive material target, and then to perform sputtering for forming an additive-containing transparent conductive material using the transparent conductive material target to which the additive has been attached without performing so-called pre-sputtering. However, formation of the first electrode is not limited to such a method.

An auxiliary electrode may be formed on a light incident surface of the first electrode. Examples of a planar shape of the auxiliary electrode include a lattice shape (double cross shape) and a shape in which a plurality of branch auxiliary electrodes extend in parallel to each other and one end or both ends of the plurality of branch auxiliary electrodes are connected to each other. The auxiliary electrode can be constituted by, for example, AuGe layer/Ni layer/Au layer, Mo layer/Ti layer/Pt layer/Au layer, Ti layer/Pt layer/Au layer, or Ni layer/Au layer, and can be formed on the basis of a physical vapor deposition method (PVD method) such as a sputtering method or a vacuum vapor deposition method, for example. Note that the layer described at the head of "/" occupies a side of the first electrode. In addition, an antireflection film may be formed on a light incident surface of the first electrode. As a material constituting the antireflection film, a material having a smaller refractive index than that of a compound semiconductor constituting an uppermost compound semiconductor layer is preferably used. Specific examples thereof include a layer containing $TiO_2$, $Al_2O_3$, ZnS, $MgF_2$, $Ta_2O_5$, $SiO_2$, $Si_3N_4$, or $ZrO_2$, and a laminated structure of these layers. The antireflection film can be formed on the basis of a PVD method such as a sputtering method, for example.

In the imaging device or the like of the present disclosure, the second electrode is formed in contact with the second compound semiconductor layer. Examples of a material constituting the second electrode include molybdenum (Mo), tungsten (W), tantalum (Ta), vanadium (V), palladium (Pd), zinc (Zn), nickel (Ni), titanium (Ti), platinum (Pt), gold-zinc (Au—Zn), gold-germanium (AuGe), chromium (Cr), gold (Au), aluminum (Al), and a laminated structure of Ti/W or Ti/W/Cu.

In the imaging device or the like of the present disclosure, various compound semiconductor layers can be formed, for example, on the basis of a metal organic-chemical vapor deposition method (MOCVD method), a metal organic-vapor phase epitaxy method (MOVPE method), a molecular beam epitaxy method (MBE method), a hydride-vapor phase epitaxy method (HVPE method) in which a halogen contributes to transport or a reaction, an atomic layer deposition method (ALD method), a migration-enhanced epitaxy method (MEE Method), a plasma-assisted physical vapor deposition method (PPD method), or the like.

Examples of the film formation substrate include a substrate containing a group III-V semiconductor. Specific examples of the substrate containing a group III-V semiconductor include a GaAs substrate, an InP substrate, a GaN substrate, an AlN substrate, a GaP substrate, a GaSb substrate, an InSb substrate, an InAs substrate, and the like. Examples thereof further include a silicon semiconductor substrate, a sapphire substrate, a SiC substrate, a quartz glass substrate, a sapphire substrate, and the like. A driving substrate can be constituted by a silicon semiconductor substrate. In addition, it is only required to form various circuits for driving a light-receiving element on the driving substrate.

Alternatively, a connecting portion formed on the driving substrate may be constituted by, for example, a bump portion for connecting a light-receiving element to the second electrode. In addition, the second electrode or the contact portion formed on the film formation substrate is connected to the bump portion disposed on a silicon semiconductor substrate. In addition, a through contact VIA (TCV) can also be used for connection. It is only required to remove the film formation substrate by an etching method, a polishing method, a CMP method, a laser ablation method, a heating method, or the like.

A filter (for example, a color filter, a visible light cut filter, an infrared cut filter) that allows light of a desired wavelength disposed on a light incident side of a light-receiving element to pass therethrough may be included, and a condenser lens (on-chip lens) may be included. That is, a planarization film may be formed on the antireflection film, and a filter and a condenser lens (on-chip lens) may be formed on the planarization film.

In some cases, a light-receiving element may be fixed to a supporting substrate via the second electrode. Also in this case, after the light-receiving element is formed on a film formation substrate, it is only required to fix or stick the light-receiving element to the supporting substrate, and then to remove the film formation substrate from the light-receiving element. Examples of a method for removing the film formation substrate from the light-receiving element include the above-described method. In addition, examples of a method for fixing or sticking the light-receiving element to the supporting substrate include a metal joining method, a semiconductor joining method, and a metal/semiconductor joining method in addition to a method using an adhesive. In addition to the substrates exemplified as the film formation substrate, examples of the supporting substrate include a transparent inorganic substrate such as a glass substrate or a quartz substrate, and a transparent plastic substrate or film such as a polyester resin including polyethylene terephthalate (PET) and polyethylene naphthalate (PEN); a polycarbonate (PC) resin; a polyether sulfone (PES) resin; a polyolefin resin including polystyrene, polyethylene, and polypropylene; a polyphenylene sulfide resin; a polyvinylidene fluoride resin; a tetraacetyl cellulose resin; a brominated phenoxy resin; an aramid resin; a polyimide resin; a polystyrene resin; a polyarylate resin; a polysulfone resin; an acrylic resin; an epoxy resin; a fluorocarbon resin; a silicone resin; a diacetate resin; a triacetate resin; a polyvinyl chloride resin; or a cyclic polyolefin resin. Examples of the glass substrate include a soda glass substrate, a heat-resistant glass substrate, and a quartz glass substrate.

An imaging element such as a CMOS image sensor or a CCD image sensor is constituted by a light-receiving element. A configuration and a structure of the imaging device except for a light-receiving element can be the same as a configuration and a structure of a well-known imaging device, and various kinds of processing of a signal obtained by the light-receiving element can be performed on the basis of a well-known circuit.

A light-receiving element unit in the imaging device may be constituted by (A) one light-receiving element (receiving light in a visible region to an infrared region) in the present disclosure, (B) one first light-receiving element (receiving visible light) with an infrared cut filter in the present disclosure and one light-receiving element (receiving infrared light) with a visible light cut filter in the present disclosure, (C) one red light-receiving element (receiving a red color) with a red filter for transmitting a red color in the present disclosure, one green light-receiving element (receiving a green color) with a green filter for transmitting a green color in the present disclosure, one blue light-receiving element (receiving a blue color) with a blue filter for transmitting a blue color in the present disclosure, and one infrared light-receiving element (receiving infrared light) with a visible light cut filter in the present disclosure, or (D) a light-receiving element that receives visible light and one light-receiving element (receiving infrared light) with a visible light cut filter in the present disclosure.

Here, specific examples of the above item (D) include a lamination type light-receiving element unit. More specific examples thereof include:

(D-1) a laminated structure of a light-receiving portion in a blue light-receiving element sensitive to blue light/the light-receiving element for receiving infrared light in the present disclosure;

(D-2) a laminated structure of a light-receiving portion in a green light-receiving element sensitive to green light/the light-receiving element for receiving infrared light in the present disclosure;

(D-3) a laminated structure of a light-receiving portion in a red light-receiving element sensitive to red light/the light-receiving element for receiving infrared light in the present disclosure;

(D-4) a laminated structure of a light-receiving portion in a blue light-receiving element sensitive to blue light/a light-receiving portion in a green light-receiving element sensitive to green light/the light-receiving element for receiving infrared light in the present disclosure;

(D-5) a laminated structure of a light-receiving portion in a green light-receiving element sensitive to green light/a light-receiving portion in a blue light-receiving element sensitive to blue light/the light-receiving element for receiving infrared light in the present disclosure;

(D-6) a laminated structure of a light-receiving portion in a blue light-receiving element sensitive to blue light/a light-receiving portion in a red light-receiving element sensitive to red light/the light-receiving element for receiving infrared light in the present disclosure;

(D-7) a laminated structure of a light-receiving portion in a green light-receiving element sensitive to green light/a light-receiving portion in a red light-receiving element sensitive to red light/the light-receiving element for receiving infrared light in the present disclosure;

(D-8) a laminated structure of a light-receiving portion in a green light-receiving element sensitive to green light/a light-receiving portion in a blue light-receiving element sensitive to blue light/a light-receiving portion in a red light-receiving element sensitive to red light/the light-receiving element for receiving infrared light in the present disclosure; and (D-9) a laminated structure of a light-receiving portion in a blue light-receiving element sensitive to blue light/a light-receiving portion in a green light-receiving element sensitive to green light/a light-receiving portion in a red light-receiving element sensitive to red light/the light-receiving element for receiving infrared light in the present disclosure. Note that a light receiving portion described earlier is located closer to a light incident side.

Example 1

Figure 1:
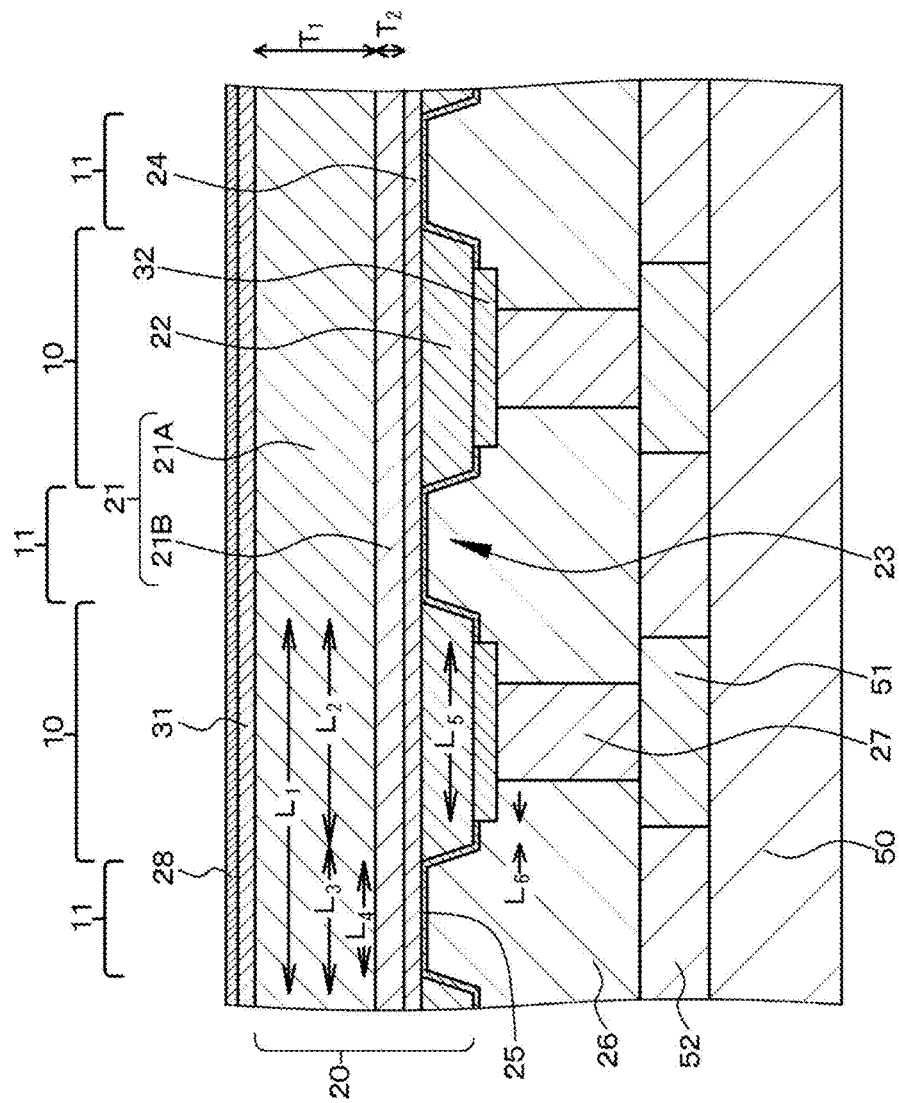
FIG. 1 is a schematic partial end view of an imaging device of Example 1.

Example 1 relates to the imaging device according to the first aspect of the present disclosure and a method for manufacturing the imaging device. FIG. 1 illustrates a schematic partial end view of the imaging device of Example 1.

In the imaging device of Example 1 or each of Examples 2 to 9 described below, a plurality of light-receiving elements 10 is arranged in a two-dimensional matrix shape, each of the light-receiving elements 10 includes a first electrode 31, a photoelectric conversion layer 20, and a second electrode 32, the photoelectric conversion layer 20 has a laminated structure in which a first compound semiconductor layer 21 having a first conductivity type (specifically, n-type) and a second compound semiconductor layer 22 having a second conductivity type (specifically, p-type) that is a reverse conductivity type to the first conductivity type are laminated from a side of the first electrode, the second compound semiconductor layer 22 in a region 11 between the light-receiving elements 10 has been removed, and the first electrode 31 and the first compound semiconductor layer 21 are shared by the light-receiving elements.

In the imaging device of Example 1, an impurity concentration of the first compound semiconductor layer 21 near the first electrode 31 is lower than that of the first compound semiconductor layer 21 near the second compound semiconductor layer 22. Specifically, in Example 1, the first compound semiconductor layer 21 has a two-layer structure of a first layer 21A located on a side of the first electrode and having a low impurity concentration and a second layer 21B located on a side of the second compound semiconductor layer and having a high impurity concentration. Here, the first impurity concentration in the first layer 21A of the first compound semiconductor layer 21 is $1 \times 10^{14}$ cm$^{-3}$ to $5 \times 10^{15}$ cm$^{-3}$, and the impurity concentration in the second layer 21B of the first compound semiconductor layer 21 is $5 \times 10^{15}$ cm$^{-3}$ to $1 \times 10^{18}$ cm$^{-3}$. In addition, the second layer 21B of the first compound semiconductor layer 21 is thinner than the first layer 21A of the first compound semiconductor layer 21.

In the imaging device of Example 1 or each of Examples 2 to 9 described below, the first compound semiconductor layer 21 contains an n-InGaAs layer (for example, $In_{0.53}Ga_{0.47}As$), and the second compound semiconductor layer 22 contains a p$^+$-InP layer having a thickness of 0.1 µm. In addition, a p-AlInAs layer 24 is formed between the first compound semiconductor layer 21 and the second compound semiconductor layer 22. The p-AlInAs layer 24 extends in a region from which the second compound semiconductor layer 22 has been removed, located between the light-receiving elements 10 (second compound semiconductor layer/removed region 23). An extending portion 24A of the p-AlInAs layer 24 functions as an etching stop layer, and can reliably prevent generation of a damage in the first compound semiconductor layer 21 when the second compound semiconductor layer 22 is removed in a region between the light-receiving elements 10.

A passivation film 25 containing SiN and having a thickness of 0.05 µm is formed on the second compound semiconductor layer 22, and this makes recombination of carriers difficult. The first electrode 31 functioning as a cathode electrode (negative electrode) (that is, functioning as an electrode for extracting electrons) contains ITO, ITiO, or NiO having a thickness of 0.02 µm, or has a laminated structure of layers containing these materials. Meanwhile, the second electrode 32 functioning as an anode electrode (positive electrode) (that is, functioning as an electrode for extracting holes) has a laminated structure of Ti/W. A p-side contact layer (not illustrated) containing p$^{++}$-InGaAS having a thickness of 0.05 µm is formed between the second electrode 32 and the second compound semiconductor layer 22. An insulating layer 26 containing an insulating material such as $SiO_2$ is formed on the second electrode 32 and the passivation film 25. In addition, a contact portion 27 containing copper (Cu) connected to the second electrode 32 is formed in the insulating layer 26. In the example illustrated in FIG. 1, a driving substrate 50 on which a readout integrated circuit (ROIC) (not illustrated) and a connecting portion 51 containing copper (Cu) are formed and the light-receiving element 10 are superposed on each other such that the connecting portion 51 is in contact with the contact portion 27, and the connecting portion 51 is joined to the contact portion 27 to be laminated. An antireflection film 28 containing $SiO_2$ is formed on a light incident surface of the first electrode 31. An insulating material layer 52 is formed on the driving substrate 50 between the connecting portions 51.

In the imaging device of Example 1 or each of Examples 2 to 9 described below, an arrangement pitch of the light-receiving elements 10 is 5 µm or less. An imaging element such as a CMOS image sensor or a CCD image sensor is constituted by the light-receiving elements 10.

By setting an arrangement pitch ($L_1$) of the light-receiving elements 10 to 5 µm, and setting the values of $L_1$, $L_2$, $L_3$, $L_4$, $L_5$, and $L_6$, a thickness $T_1$ of the first compound semiconductor layer 21, and a thickness $T_2$ of the second compound semiconductor layer 22 illustrated in FIG. 1 as illustrated in Table 1 below, an electric field potential was simulated. A distance between adjacent light-receiving elements (distance between adjacent pixels) was $L_4=1.0$ μm. 0 V was applied to the first electrode 31 and −0.1 V was applied to the second electrode 32.

TABLE 1

$L_1$: 5.0 μm
$L_2$: 3.5 μm
$L_3$: 1.5 μm
$L_4$: 1.0 μm
$L_5$: 2.3 μm
$L_6$: 0.6 μm
$T_1$: 3.0 μm
$T_2$: 0.15 μm

For studies, first, simulation of an electric field potential in a light-receiving element in which an impurity concentration of the first compound semiconductor layer 21 was fixed to $1\times10^{15}$ cm$^{-3}$ was performed. Results thereof are illustrated in FIG. 2A. A potential in the second compound semiconductor layer 22 (referred to as "potential-A" for convenience) was −0.6 V, a potential in a region at a depth of 0.1 μm from an exposed surface of the first compound semiconductor layer 21 in the second compound semiconductor layer/removed region 23 (referred to as "potential-B" for convenience) was 0.0 V. A result that depletion layers were connected to each other in adjacent light-receiving elements was obtained. That is, in a case where the impurity concentration of the first compound semiconductor layer 21 is fixed at $1\times10^{15}$ cm$^{-3}$, a difference between the potential-A and the potential-B is 0.6 V. It has been found that it is impossible to prevent carriers (holes) generated in the light-receiving element-B from entering the light-receiving element-A with such a potential difference. Next, simulation of an electric field potential in a light-receiving element in which the impurity concentration of the first compound semiconductor layer 21 was fixed to $5\times10^{15}$ cm$^{-3}$ or $1\times10^{16}$ cm$^{-3}$ was performed. As a result, in both cases, the potential-A was −0.6 V and the potential-B was 0.2 V. That is, a potential difference was 0.8 V. It has been found that it is possible to prevent carriers (holes) generated in the light-receiving element-B from entering the light-receiving element-A. However, if the impurity concentration of the first compound semiconductor layer 21 is set to such an impurity concentration, it is difficult to suppress generation of a dark current.

Therefore, simulation of an electric field potential was performed with the first compound semiconductor layer 21 having a two-layer structure as illustrated in Table 2 below. As a result, the potential-A was −0.6 V and the potential-B was 0.2 V. That is, a potential difference was 0.8 V (refer to FIG. 2B). It has been found that it is possible to prevent carriers (holes) generated in the light-receiving element-B from entering the light-receiving element-A.

TABLE 2

| First compound semiconductor layer 21 | Thickness (μm) | Impurity concentration |
|---|---|---|
| First layer 21A | 2.75 | $1 \times 10^{15}$ cm$^{-3}$ |
| First layer 21B | 0.25 | $1 \times 10^{16}$ cm$^{-3}$ |

Next, by setting the arrangement pitch ($L_1$) of the light-receiving elements 10 to 3.7 μm, and setting the values of $L_1$, $L_2$, $L_3$, $L_4$, $L_5$, and $L_6$ and the thickness $T_1$ of the first compound semiconductor layer 21 illustrated in FIG. 1 as illustrated in Table 3 below, an electric field potential was simulated. A distance between adjacent light-receiving elements (distance between adjacent pixels) was $L_4=1.0$ μm. 0 V was applied to the first electrode 31 and −0.1 V or −1.0 V was applied to the second electrode 32.

TABLE 3

$L_1$: 3.7 μm
$L_2$: 2.2 μm
$L_3$: 1.5 μm
$L_4$: 1.0 μm
$L_5$: 1.6 μm
$L_6$: 0.3 μm
$T_1$: 3.0 μm

Table 4 and FIGS. 3A, 3B, 4A, 4B, 5A, and 5B illustrate results of simulation of an electric field potential. The mark "o" in evaluation in Table 4 indicates that a difference between the potential-A and the potential-B is 0.8 V, and that the light-receiving element can prevent carriers (holes) generated in the light-receiving element-B from entering the light-receiving element-A. Meanwhile, the mark "x" indicates that a difference between the potential-A and the potential-B is less than 0.8 V, and that the light-receiving element cannot prevent carriers (holes) generated in the light-receiving element-B from entering the light-receiving element-A.

TABLE 4

| Voltage applied to second electrode (V) | First compound semiconductor layer 21 | | | | Evaluation | Drawing |
|---|---|---|---|---|---|---|
| | First layer 21A | | Second layer 21B | | | |
| | Thickness (μm) | Impurity concentration | Thickness (μm) | Impurity concentration | | |
| −0.1 | 3.0 | $5 \times 10^{14}$/cm$^3$ | 0.10 | $1 \times 10^{16}$/cm$^3$ | X | FIG. 3A |
| | | | 0.15 | | O | FIG. 3B |
| | | | 0.25 | | O | |
| | | | 0.005 | $1 \times 10^{17}$/cm$^3$ | O | |
| | | | 0.01 | | O | |
| | | | 0.02 | | O | |
| | | | 0.05 | | O | |
| | | | 0.002 | $1 \times 10^{18}$/cm$^3$ | X | |
| | | | 0.005 | | O | |
| | | | 0.01 | | O | |

TABLE 4-continued

| Voltage applied to second electrode (V) | First compound semiconductor layer 21 | | | | Evaluation | Drawing |
|---|---|---|---|---|---|---|
| | First layer 21A | | Second layer 21B | | | |
| | Thickness (μm) | Impurity concentration | Thickness (μm) | Impurity concentration | | |
| −1.0 | 3.0 | $5 \times 10^{14}/cm^3$ | 0.10 | $1 \times 10^{16}/cm^3$ | X | |
| | | | 0.15 | | X | FIG. 4A |
| | | | 0.25 | | ○ | FIG. 4B |
| | | | 0.005 | $1 \times 10^{17}/cm^3$ | X | |
| | | | 0.01 | | X | |
| | | | 0.02 | | X | FIG. 5A |
| | | | 0.05 | | ○ | FIG. 5B |
| | | | 0.002 | $1 \times 10^{18}/cm^3$ | X | |
| | | | 0.005 | | ○ | |
| | | | 0.01 | | ○ | |

From the above results, it has been found that a difference between the potential-A and the potential-B is 0.8 V by setting the impurity concentration in the first layer 21A of the first compound semiconductor layer 21 to $1 \times 10^{14}$ cm$^{-3}$ to $5 \times 10^{15}$ cm$^{-3}$, preferably $1 \times 10^{14}$ cm$^{-3}$ to $1 \times 10^{15}$ cm$^{-3}$, and setting the impurity concentration in the second layer 21B of the first compound semiconductor layer 21 to $5 \times 10^{15}$ cm$^{-3}$ to $1 \times 10^{18}$ cm$^{-3}$, preferably $1 \times 10^{16}$ cm$^{-3}$ to $1 \times 10^{18}$ cm$^{-3}$, and that it is possible to prevent carriers (holes) generated in the light-receiving element-B from entering the light-receiving element-A. However, the values (or ranges) of these impurity concentrations also depend on a value of a reverse bias voltage applied between the first electrode 31 and the second electrode 32 and the thickness of the second layer 21B of the first compound semiconductor layer 21. Therefore, it is only required to determine an appropriate impurity concentration in the first layer 21A and the second layer 21B of the first compound semiconductor layer 21 while the value of the reverse bias voltage applied between the first electrode 31 and the second electrode 32 and the thickness of the second layer 21B of the first compound semiconductor layer 21 are considered. Note that a value of a reverse bias voltage is usually set between −0.1 V and −1.0 V in actual driving of the imaging device.

Each of FIGS. 9A, 9B, and 10 schematically illustrates an arrangement of light-receiving element units in the imaging device of Example 1. Note that a light-receiving element unit is indicated by a solid line rectangle in FIGS. 9A, 9B, and 10, and the light-receiving element is indicated by a dotted line in FIGS. 9B and 10.

In FIG. 9A illustrating 4×4 light-receiving elements, the light-receiving element unit in the imaging device of Example 1 is constituted by one light-receiving element 101 of Example 1, and the light-receiving element 101 receives light in a visible region to an infrared region. In addition, this makes it possible to obtain an image in which a white/black (monochrome) image and an image based on infrared light are illustrated in one image.

In FIG. 9B illustrating 2×4 light-receiving element units (one light-receiving element unit is constituted by 1×2 light-receiving elements), the light-receiving element unit in the imaging device of Example 1 is constituted by a first light-receiving element 101W constituted by one light-receiving element of Example 1, including an infrared cut filter, and a second light-receiving element 102 constituted by one light-receiving element of Example 1, including a visible light cut filter. Here, the first light-receiving element 101W receives visible light and the second light-receiving element 102 receives infrared light. In addition, this makes it possible to image a white/black (monochrome) and an image based on infrared light independently.

In FIG. 10 illustrating 2×2 light-receiving element units (one light-receiving element unit is constituted by 2×2 light-receiving elements), the light-receiving element unit in the imaging device of Example 1 includes a red light-receiving element 101R constituted by one light-receiving element of Example 1, including a red filter for transmitting a red color, a green light-receiving element 101G constituted by one light-receiving element of Example 1, including a green filter for transmitting a green color, a blue light-receiving element 101B constituted by one light-receiving element of Example 1, including a blue filter for transmitting a blue color, and an infrared light-receiving element 102 constituted by one light-receiving element of Example 1, including a visible light cut filter. Here, the red light-receiving element 101R receives a red color, the green light-receiving element 101G receives a green color, the blue light-receiving element 101B receives a blue color, and the infrared light-receiving element 102 receives infrared light. In addition, this makes it possible to image a color image and an image based on infrared light independently.

Hereinafter, a method for manufacturing the imaging device of Example 1 will be described with reference to the drawings. Note that the driving substrate 50 on which the readout integrated circuit (ROIC) constituting various circuits for driving a light-receiving element and the connecting portion 51 containing copper (Cu) are formed is prepared in advance.

[Step-100]

First, the photoelectric conversion layer 20 having a laminated structure in which the first compound semiconductor layer 21 (first layer 21A and second layer 21B) having a first conductivity type (specifically, n-type) and the second compound semiconductor layer 22 having a second conductivity type (specifically, p-type) that is a reverse conductivity type to the first conductivity type are laminated is formed on a film formation substrate 60 containing n$^+$-InP on the basis of a well-known MOCVD method. Incidentally, as described above, the impurity concentration of the first compound semiconductor layer 21 near the film formation substrate (specifically, impurity concentration of first layer 21A) is lower than that of the first compound semiconductor layer 21 near the second compound semiconductor layer 22 (specifically, impurity concentration of second layer 21B). Note that an etching stop layer (not illustrated) containing n-InGaAs is formed between the film formation substrate 60 and the first compound semiconductor layer 21 in Example 1. In addition, a buffer layer containing n$^+$-InP and having a thickness of 0.3 μm, an n-side contact layer containing n++-InGaAs and having a thickness of 10 nm, an a window layer containing n+-InP and having a thickness of 20 nm (these are not illustrated) may be formed between the etching stop layer and the first compound semiconductor layer 21. Furthermore, the p-AlInAs layer 24 is formed between the first compound semiconductor layer 21 and the second compound semiconductor layer 22.

[Step-110]

Thereafter, on the basis of a well-known method, the second electrode 32 is formed on a region of the second compound semiconductor layer 22 where the light-receiving element 10 should be formed on the basis of a well-known method (refer to FIG. 6A). Note that a p-side contact layer may be formed on the second compound semiconductor layer 22. Subsequently, the second compound semiconductor layer 22 in the region 11 between the light-receiving elements 10 is removed on the basis of photolithography technology and etching technology (for example, wet etching technology) (refer to FIG. 6B). The p-AlInAs layer 24 functioning as an etching stop layer is formed. Therefore, the first compound semiconductor layer 21 is not damaged during etching of the second compound semiconductor layer 22. In this way, it is possible to obtain a plurality of light-receiving elements 10 separated from each other by the second compound semiconductor layer/removed region 23 and arranged in a two-dimensional matrix shape. Subsequently, the passivation film 25 is formed on the entire surface except for a region where the second electrode 32 is formed.

[Step-120]

Thereafter, the insulating layer 26 containing SiO$_2$ is formed on the entire surface on the basis of a well-known CVD method. Then, an opening 27A is formed in the insulating layer 26 above the second electrode 32 on the basis of well-known photolithography technology and etching technology, and the opening 27A is filled with a conductive material (specifically, copper) on the basis of, for example, a plating method. The contact portion 27 connected to the second electrode 32 can be thereby obtained. Thereafter, the conductive material on the insulating layer 26 is removed. In this way, the structure illustrated in FIG. 7 can be obtained.

[Step-130]

Next, the driving substrate 50 on which the readout integrated circuit and the connecting portion 51 are formed and the film formation substrate 60 are superposed on each other such that the connecting portion 51 is in contact with the contact portion 27, and the connecting portion 51 is joined to the contact portion 27 on the basis of a metal joining method (refer to FIG. 8).

A bump portion containing an In alloy or a Sn alloy for connection with the second electrode 32 of a light-receiving element may be formed on the driving substrate 50, and the second electrode 32 formed on the film formation substrate 60 or the contact portion 27 may be connected to the bump portion disposed on the driving substrate 50.

[Step-140]

Thereafter, a substantial part of the film formation substrate 60 is removed on the basis of a polishing method, and the film formation substrate 60 is further removed on the basis of an etching method using an aqueous HCl solution. Note that a substantial part of the film formation substrate 60 may be removed by a CMP method, a laser ablation method, a heating method, or the like in place of the polishing method. The etching stop layer containing n-InGaAs is formed between the film formation substrate 60 and the first compound semiconductor layer 21. Therefore, when the film formation substrate 60 is removed on the basis of the etching method, the first compound semiconductor layer 21 is not damaged. Then, the first electrode 31 containing, for example, ITO/NiO is formed on the exposed first compound semiconductor layer 21 on the basis of a well-known method, and the antireflection film 28 is further formed on the first electrode 31. In this manner, the imaging device illustrated in FIG. 1 can be obtained.

Note that a planarization film (not illustrated) may be formed on the antireflection film 28, and a filter and a condenser lens (on-chip lens) may be further formed on the planarization film.

As described above, in the light-receiving element of Example 1 or a light-receiving element obtained by the method for manufacturing the imaging device of Example 1, the second compound semiconductor layer has been removed in a region between the light-receiving elements. In addition, the impurity concentration of the first compound semiconductor layer near the first electrode is lower than that of the first compound semiconductor layer near the second compound semiconductor layer. In this way, a gradient is given to the impurity concentration of the first compound semiconductor layer. Therefore, when a reverse bias voltage is applied between the first electrode and the second electrode, in the first compound semiconductor layer in the second compound semiconductor layer/removed region, a region of a potential which carriers (for example, holes) cannot enter is generated. As a result, it is possible to reliably prevent carriers (for example, holes) generated in the light-receiving element-B from entering the light-receiving element-A. In addition, the impurity concentration of the first compound semiconductor layer near the first electrode is lower than that of the first compound semiconductor layer near the second compound semiconductor layer. Therefore, generation of a dark current can be suppressed. Furthermore, a region of a potential at which carriers (for example, holes) cannot enter the first compound semiconductor layer is formed in the second compound semiconductor layer/removed region. However, no defect is generated in the photoelectric conversion layer at the time of forming such a region.

In addition, the first electrode 31 which is a solid electrode is formed on the photoelectric conversion layer 20 and the second electrode 32 is formed under the photoelectric conversion layer 20. Therefore, a configuration and a structure of light-receiving elements are simplified. Furthermore, since the first electrode 31 is a solid electrode, as compared with a configuration in which wiring is individually formed for the first electrode of each of the light-receiving elements, a distance of movement of electrons after the electrons are taken out of the first electrode 31 before the electrons reach a circuit for driving the light-receiving elements does not vary depending on the position of each of the light-receiving elements. In addition, a signal is taken out in a thickness direction of a laminated structure constituting the light-receiving elements (signal is taken out in a vertical direction of a pn structure), and therefore variation in accuracy of the signal is hardly generated.

Example 2

Example 2 is a modification of Example 1. As illustrated in a schematic partial cross-sectional view in FIG. 11, in the light-receiving element 10 of the imaging device of Example 2, a third compound semiconductor layer 41 containing undoped InP is formed in the second compound semiconductor layer/removed region 23 on the basis of an epitaxial growth method. By forming the undoped third compound semiconductor layer 41 having few crystal defects and a low level density, generation of a dark current can be further suppressed. As illustrated in FIG. 11, the third compound semiconductor layer 41 may extend onto the second compound semiconductor layer 22. The configuration and structure of the imaging device of Example 2 can be similar to those of the imaging device of Example 1 except for the above points, and therefore detailed description will be omitted.

Example 3

Example 3 relates to the imaging device according to the second aspect of the present disclosure and a method for manufacturing the imaging device. As illustrated in a schematic partial cross-sectional view in FIG. 12, in the imaging device of Example 3, an element isolation region 42 is formed in the first compound semiconductor layer 21 in a region from which the second compound semiconductor layer 22 has been removed, located between the light-receiving elements 10 (second compound semiconductor layer/removed region 23). The element isolation region 42 includes a high resistance region and is formed on the basis of an ion implantation method using boron ions.

Incidentally, in the example illustrated in FIG. 12, unlike in Example 1, the first compound semiconductor layer 21 has one layer. However, as illustrated in FIG. 13, the first compound semiconductor layer 21 may have a two-layer structure of the first layer 21A and the second layer 21B in a similar manner to Example 1. In addition, the third compound semiconductor layer 41 of Example 2 may be applied to Example 3.

In a method for manufacturing the imaging device of Example 3, first, the photoelectric conversion layer 20 having a laminated structure in which the first compound semiconductor layer 21 having a first conductivity type and the second compound semiconductor layer 22 having a second conductivity type that is a reverse conductivity type to the first conductivity type are laminated is formed on the film formation substrate 60. Specifically, approximately similar steps to [Step-100] of Example 1 are performed. Incidentally, in film formation of the first compound semiconductor layer 21, the first compound semiconductor layer 21 may have a single-layer structure or a two-layer structure similarly to Example 1.

Next, the second electrode 32 is formed in a region of the second compound semiconductor layer 22 where a light-receiving element should be formed, and the second compound semiconductor layer 22 in the region 11 between light-receiving elements is removed. Specifically, similar steps to [Step-110] of Example 1 are performed.

Thereafter, the element isolation region 42 is formed in the first compound semiconductor layer 21 in the region 11 from which the second compound semiconductor layer 22 has been removed, located between the light-receiving elements 10, on the basis of an ion implantation method of boron ions. In this way, it is possible to obtain a plurality of light-receiving elements 10 arranged in a two-dimensional matrix shape.

Subsequently, by performing similar steps to [Step-130] to [Step-140] of Example 1, the imaging device illustrated in FIG. 12 or 13 can be obtained.

In prior art, an element isolation region needs to be formed over a part of the second compound semiconductor layer and the first compound semiconductor layer on the basis of an ion implantation method. Therefore, at the time of ion implantation, a high acceleration voltage is required, and many defects are generated in the second compound semiconductor layer and the first compound semiconductor layer near the element isolation region disadvantageously. However, in the light-receiving element in the imaging device of Example 3 or a light-receiving element obtained by the method for manufacturing the imaging device of Example 3, the element isolation region is formed in the first compound semiconductor layer in the second compound semiconductor layer/removed region. That is, it is only required to form the element isolation region only on a part of the first compound semiconductor layer on the basis of an ion implantation method. Therefore, a high acceleration voltage is not required, and defects are hardly generated in the photoelectric conversion layer. In addition, formation of the element isolation region makes it possible to reliably prevent carriers (for example, holes) generated in the light-receiving element-B from entering the light-receiving element-A.

Example 4

Example 4 is a modification of the imaging devices of Examples 1 to 3. In a light-receiving element 10A in the imaging device of Example 4, as illustrated in a schematic partial cross-sectional view in FIG. 14, a surface recombination preventing layer 43 containing a compound semiconductor is formed between the first electrode 31 and the first compound semiconductor layer 21. Here, the surface recombination preventing layer 43 (also referred to as window layer) has a thickness of 30 nm or less and contains n-type InP.

FIG. 16 illustrates an optical absorption coefficient of InGaAs (indicated by "A" in FIG. 16) and an optical absorption coefficient of Si (indicated by "B" in FIG. 16) using a wavelength as a parameter. In addition, for reference, FIG. 17 illustrates a quantum efficiency of InGaAs in the presence/absence of an InP substrate using a wavelength as a parameter (specifically, "A" in FIG. 17 illustrates the presence of the InP substrate and "B" in FIG. 17 illustrates a state in which the InP substrate is etched so as to be as thin as possible and has been removed). As described above, Si cannot absorb light having a wavelength of about 1.1 μm or more, but InGaAs can absorb light in a visible region to an infrared region. In addition, FIG. 18 illustrates a calculation result of a relationship among the thickness of an InP layer, the wavelength of light incident on the InP layer, and the light transmittance of the InP layer. In FIG. 18, "A" represents data when the thickness of the InP layer is 10 nm, "B" represents data when the thickness of the InP layer is 30 nm, "C" represents data when the thickness of the InP layer is 50 nm, "D" represents data when the thickness of the InP layer is 80 nm, "E" represents data when the thickness of the InP layer is 1 μm, and "F" represents data when the thickness of the InP layer is 5 μm. FIG. 18 indicates that a thin InP layer can sufficiently transmit visible light, but a thick InP layer hinders passage of visible light. Here, when the thickness of the surface recombination preventing layer 43 containing InP exceeds 30 nm, absorption of visible light in the surface recombination preventing layer 43 containing InP increases disadvantageously. Therefore, the thickness of the surface recombination preventing layer 43 is specified to be 30 nm or less.

Each of FIGS. 19A and 19B illustrates a conceptual diagram of a band structure in the light-receiving element of Example 4 (provided that the first electrode 31 is not formed). Incidentally, in FIGS. 19A and 19B and FIGS. 20 and 21 described later, an open circle schematically indicates a hole, and a black circle schematically indicates an electron. Here, FIG. 19A illustrates a case where the thickness of the surface recombination preventing layer 43 is 30 nm or less and is an appropriate thickness, and FIG. 19B illustrates a case where the thickness of the surface recombination preventing layer 43 is too thin. When the thickness of the surface recombination preventing layer 43 is too thin, holes existing near an interface between the surface recombination preventing layer 43 and the photoelectric conversion layer 20 are recombined with each other on a surface. As a result, a hole-electron pair disappears. A lower limit value of the thickness of the surface recombination preventing layer 43 may be 10 nm. In addition, FIG. 20 illustrates a conceptual diagram of a band structure in a state where the first electrode 31 is formed. The first electrode 31 containing ITO, ITiO, or NiO that behaves as an n-type semiconductor is formed, and therefore holes are subjected to double block reflection. As a result, surface recombination less occurs. Then, by applying a reverse bias voltage to the first electrode 31 and the second electrode 32, the light-receiving element 10A is operated.

In Example 4, the surface recombination preventing layer 43 has a thickness of 30 nm or less, specifically, a thickness of 10 nm. Therefore, the surface recombination preventing layer 43 containing InP can transmit light in a visible region to an infrared region, and the photoelectric conversion layer 20 containing InGaAs can absorb light in a visible region to an infrared region and can further suppress surface recombination. Therefore, it is possible to provide a light-receiving element having high sensitivity in a visible region to an infrared region.

As described above, the surface recombination preventing layer or a contact layer described below has a thickness of a predetermined thickness or less. Therefore, visible light and infrared light can pass through the surface recombination preventing layer, and it is possible to provide an imaging device including a light-receiving element having high sensitivity to visible light to infrared light. Furthermore, as described below, inclusion of the contact layer can reduce a contact resistance.

Example 5

Example 5 is a modification of Example 4. In a light-receiving element 10B in the imaging device of Example 5, as illustrated in a schematic partial cross-sectional view in FIG. 15, a contact layer 44 containing a compound semiconductor is formed between the first electrode 31 and the surface recombination preventing layer 43. In addition, the contact layer 44 has a thickness of 20 nm or less. Specifically, in the light-receiving element 10B of the Example 5, the contact layer 44 contains n-type InGaAs (that is, the compound semiconductor is an $n^+$ type compound semiconductor), the surface recombination preventing layer 43 contains n-type InP.

FIG. 21 illustrates a conceptual diagram of a band structure in the light-receiving element of Example 5. In Example 5, the contact layer 44 having a thickness of 10 nm is formed. In the contact layer 44, electrons are saturated. Therefore, light is not absorbed by the contact layer 44, and the contact layer 44 is in a transparent state. In addition, the contact layer 44 contains n-type InGaAs, and therefore a contact resistance can be reduced. Incidentally, the n-type impurity concentrations of the contact layer 44 and the surface recombination preventing layer 43 are, for example, as illustrated in Table 5 below. In addition, as in Example 4, the first electrode 31 containing ITO, ITiO, or NiO that behaves as an n-type semiconductor is formed, and therefore holes are subjected to double block reflection. As a result, surface recombination less occurs. Here, when the thickness of the contact layer 44 containing InGaAs exceeds 20 nm, the contact layer 44 starts to absorb light disadvantageously. Therefore, the thickness of the contact layer 44 is specified to be 20 nm or less in the light-receiving element of the imaging device of Example 5. Incidentally, if the thickness of the contact layer 44 is less than 10 nm, it is difficult to reduce a contact resistance. In addition, the impurity concentration range of the contact layer 44 may be $1 \times 10^{18}$ cm$^{-3}$ to $5 \times 10^{20}$ cm$^{-3}$, and the impurity concentration range of the surface recombination preventing layer 43 may be $1 \times 10^{17}$ cm$^{-3}$ to $5 \times 10^{19}$ cm$^{-3}$.

TABLE 5

| | |
|---|---|
| Contact layer 44: | $1 \times 10^{19}$ cm$^{-3}$ |
| Surface recombination preventing layer 43: | $5 \times 10^{18}$ cm$^{-3}$ |

Also in Example 5, the surface recombination preventing layer 43 has a thickness of 30 nm or less. Therefore, the surface recombination preventing layer 43 containing InP can transmit light in a visible region to an infrared region, and the photoelectric conversion layer 20 containing InGaAs can absorb light in a visible region to an infrared region and can further suppress surface recombination. Therefore, it is possible to provide a light-receiving element having high sensitivity in a visible region to an infrared region. In addition, the contact layer 44 not absorbing light is disposed, and therefore a contact resistance can be reduced.

Example 6

Example 6 relates a modification of Examples 1 to 5. FIG. 22 illustrates a schematic partial cross-sectional view of the imaging device of Example 6. The light-receiving elements 10, 10A, and 10B of Example 6 include the light-receiving elements 10, 10A, and 10B described in Examples 1 to 3, 4, or 5, and each includes a filter 29B for transmitting light having a desired wavelength, disposed on a light incident side of the light-receiving element 10, 10A, or 10B. In addition, in the light-receiving element of Example 6, a planarization film 29A is formed on the antireflection film 28. A filter 29B and a condenser lens (on-chip lens) 29C are formed on the planarization film 29A.

Example 7

Example 7 relates to a modification of Examples 4 to 6, specifically, to a modification of the first electrode 31.

As illustrated in a schematic partial cross-sectional view of the imaging device of Example 7 in FIG. 23, in Example 7, a first electrode 131 has a first surface 131A in contact with the surface recombination preventing layer 43 or the contact layer and a second surface 131B facing the first surface 131A, and contains a transparent conductive material. In addition, the transparent conductive material constituting the first electrode 131 contains an additive containing at least one metal selected from the group comprising a group 6 transition metal such as molybdenum, tungsten, or chromium, ruthenium, titanium, nickel, zinc, iron, and copper, or a compound thereof (specifically, molybdenum (Mo) in Example 7). The concentration of the additive contained in the transparent conductive material near an interface of the first surface 131A of the first electrode 131 is higher than that of the additive contained in the transparent conductive material near the second surface 131B of the first electrode 131. Here, ITiO was used as the transparent conductive material in Example 7.

In addition, in Example 7, the first electrode 131 has a laminated structure of a first layer $131_1$ and a second layer $131_2$ from a side of the surface recombination preventing layer 43 or the contact layer. A transparent conductive material constituting the first layer $131_1$ of the first electrode contains an additive, and a transparent conductive material constituting the second layer $131_2$ of the first electrode contains no additive. Specifically, an average concentration $Ic_1$ of the additive contained in the transparent conductive material constituting the first layer $131_1$ of the first electrode, and an average concentration $Ic_2$ of the additive contained in the transparent conductive material constituting the second layer $131_2$ of the first electrode are as illustrated in the following Table 6. In addition, if an electric resistivity of the first layer $131_1$ of the first electrode is represented by $R_1$, an electric resistivity of the first layer $131_2$ of the first electrode is represented by $R_2$, a light transmittance of the first layer $131_1$ of the first electrode at a wavelength of 400 nm to 900 nm is represented by $TP_1$, a light transmittance of the first layer $131_2$ of the first electrode is represented by $TP_2$, the thickness of the first layer $131_1$ of the first electrode is represented by $T_1$, and the thickness of the first layer $131_2$ of the first electrode is represented by $T_2$, values thereof are illustrated in Table 6. Furthermore, an average light transmittance of the first electrode 131, an average electric resistivity of the first electrode 131, and a contact resistance value between the first electrode 131 and the surface recombination preventing layer 43 or the contact layer are illustrated in the following Table 6. Note that an average light absorptivity value of the first electrode is an average value at a measurement wavelength of 400 nm to 900 nm, and is obtained by forming the first electrode (the thickness of the first layer $131_1$ is 5 nm and the thickness of the first layer $131_2$ is 25 nm) on a glass substrate, measuring a light absorptivity thereof, and subtracting a light absorptivity of the glass substrate.

TABLE 6

$Ic_1 = 1.1 \times 10^{17}$ cm$^{-3}$
$Ic_2 = 1.8 \times 10^{16}$ cm$^{-3}$
$R_1 = 2.5 \times 10^{-4}$ Ω · cm
$R_2 = 1.5 \times 10^{-4}$ Ω · cm
$TP_1 = 97\%$
$TP_2 = 99\%$
$T_1 = 5$ nm
$T_2 = 25$ nm
$Ic_1/Ic_2 = 6.1$
$R_2/R_1 = 0.6$
$TP_2 \times TP_1 = 0.96$
$T_2/T_1 = 5.0$ Average light absorptivity of first electrode = 0.98%
Average electric resistivity of first electrode = $2 \times 10^{-4}$ Ω · cm or less
Contact resistance value between first electrode and side of surface recombination preventing layer or contact layer = $2.7 \times 10^{-5}$ Ω · cm$^2$ Specifically, the first electrode 131 was formed on the basis of the following method. That is, in forming the first layer $131_1$ of the first electrode, a sputtering device in which a transparent conductive material target constituted by a transparent conductive material (ITiO) and an additive target constituted by an additive (Mo) are disposed is prepared. Then, first, sputtering is performed using an additive target, and the additive is attached to the transparent conductive material target. Subsequently, the film formation substrate 60 on which the photoelectric conversion layer 20 formed by laminating a plurality of compound semiconductor layers is formed is put in the sputtering device, and sputtering for forming the first layer $131_1$ of the first electrode is performed using the transparent conductive material target to which the additive is attached without performing so-called pre-sputtering. Thereafter, sputtering for forming the second layer $131_2$ of the first electrode is performed using a clean transparent conductive material target.

The configurations and structures of the imaging device and the light-receiving element of Example 7 can be similar to those of the imaging devices and the light-receiving elements of Examples 4 to 6 except for the above points, and therefore detailed description thereof will be omitted.

In the light-receiving element of Example 7, molybdenum (Mo) is contained as an additive in the transparent conductive material constituting the first electrode 131, and a concentration of the additive contained in the transparent conductive material near an interface of the first surface 131A of the first electrode 131 is higher than that of the additive contained in the transparent conductive material near the second surface 131B of the first electrode 131. Therefore, it is possible to provide the first electrode 131 satisfying both a low contact resistance value and a high light transmittance.

Example 8

Example 8 is a modification of Example 7.

In Example 8, the concentration of the additive contained in the transparent conductive material constituting the first electrode gradually decreases from the first surface of the first electrode toward the second surface thereof. For such a first electrode, specifically, as described in Example 7, a sputtering device in which a transparent conductive material target constituted by a transparent conductive material (ITiO) and an additive target constituted by an additive (Mo) are disposed is prepared. Then, first, sputtering is performed using an additive target, and the additive is attached to the transparent conductive material target. Subsequently, a film formation substrate on which the photoelectric conversion layer 20 formed by laminating a plurality of compound semiconductor layers is formed is put in the sputtering device, and sputtering for forming the first electrode is performed using the transparent conductive material target to which the additive is attached without performing so-called pre-sputtering. Thereafter, by performing a heat treatment, a concentration gradient of Mo which is an impurity is generated in a thickness direction of the first electrode. As a result, it is possible to obtain a structure in which a concentration of the additive contained in the transparent conductive material constituting the first electrode gradually decreases from the first surface of the first electrode toward the second surface thereof.

The configurations and structures of the imaging device and the light-receiving element of Example 8 can be similar to those of the imaging devices and the light-receiving elements of Examples 4 to 6 except for the above points, and therefore detailed description thereof will be omitted.

Example 9

In Example 9, a lamination type light-receiving element unit will be described. The lamination type light-receiving element unit is constituted by a light-receiving element for receiving visible light (referred to as a "first light-receiving element" for convenience) and a light-receiving element for receiving infrared light, including a visible light cut filter, described in Examples 1 to 8 (referred to as a "second light-receiving element" for convenience). Here, examples of a configuration of the light-receiving element unit formed by laminating a light receiving portion in a light-receiving element for receiving visible light and a light-receiving element for receiving infrared light, including a visible light cut filter, described in Examples 1 to 8, include the configurations of the above (D-1) to (D-9).

For example, each of a light receiving portion in a blue light-receiving element sensitive to blue light, a light receiving portion in a green light-receiving element sensitive to green light, and a light receiving portion in a red light-receiving element sensitive to red light has a laminated structure of a third electrode, an organic photoelectric conversion layer, and a fourth electrode. Here, the organic photoelectric conversion layer may have any one of the following four forms.

(1) The organic photoelectric conversion layer is constituted by a p-type organic semiconductor.

(2) The organic photoelectric conversion layer is constituted by an n-type organic semiconductor.

(3) The organic photoelectric conversion layer is constituted by a laminated structure of a p-type organic semiconductor layer/an n-type organic semiconductor layer, a laminated structure of a p-type organic semiconductor layer/a mixed layer (bulk hetero structure) of a p-type organic semiconductor and an n-type organic semiconductor/an n-type organic semiconductor layer, a laminated structure of a p-type organic semiconductor layer/a mixed layer (bulk hetero structure) of a p-type organic semiconductor and an n-type organic semiconductor, or a laminated structure of an n-type organic semiconductor layer/a mixed layer (bulk hetero structure) of a p-type organic semiconductor and an n-type organic semiconductor.

(4) The organic photoelectric conversion layer is constituted by a mixture (bulk hetero structure) of a p-type organic semiconductor and an n-type organic semiconductor. However, the laminating order can be arbitrarily exchanged.

Examples of the p-type organic semiconductor include a naphthalene derivative, an anthracene derivative, a phenanthrene derivative, a pyrene derivative, a perylene derivative, a tetracene derivative, a pentacene derivative, a quinacridone derivative, a thiophene derivative, a thienothiophene derivative, a benzothiophene derivative, a triallylamine derivative, a carbazole derivative, a perylene derivative, a picene derivative, a chrysene derivative, a fluoranthene derivative, a phthalocyanine derivative, a subphthalocyanine derivative, a subporphyrazine derivative, a metal complex having a heterocyclic compound as a ligand, a polythiophene derivative, a polybenzothiadiazole derivative, and a polyfluorene derivative. Examples of the n-type organic semiconductor include fullerene, a fullerene derivative, an organic semiconductor having larger (deeper) HOMO and LUMO than a p-type organic semiconductor, and a transparent inorganic metal oxide. Specific examples of the n-type organic semiconductor include a heterocyclic compound containing a nitrogen atom, an oxygen atom, or a sulfur atom. Examples thereof include an organic molecule and an organic metal complex containing a pyridine derivative, a pyrazine derivative, a pyrimidine derivative, a triazine derivative, a quinoline derivative, a quinoxaline derivative, an isoquinoline derivative, an acridine derivative, a phenazine derivative, a phenanthroline derivative, a tetrazole derivative, a pyrazole derivative, an imidazole derivative, a thiazole derivative, an oxazole derivative, an imidazole derivative, a benzimidazole derivative, a benzotriazole derivative, a benzoxazole derivative, a benzoxazole derivative, a carbazole derivative, a benzofuran derivative, a dibenzofuran derivative, a subporphyrazine derivative, a polyphenylenevinylene derivative, a polybenzothiadiazole derivative, a polyfluorene derivative, or the like in a part of the molecular skeleton, and a subphthalocyanine derivative. The thickness of the organic photoelectric conversion layer constituted by an organic photoelectric conversion material is not limited, but is for example, $1\times10^{-8}$ m to $5\times10^{-7}$ m, preferably $2.5\times10^{-8}$ m to $3\times10^{-7}$ m, more preferably $2.5\times10^{-8}$ m to $2\times10^{-7}$ m, and still more preferably $1\times10^{7}$ m to $1.8\times10^{-7}$ m. Incidentally, the organic semiconductor is often classified into a p-type and an n-type. The p-type means that holes are easily transported, and the n-type means that electrons are easily transported without being limited to interpretation that the organic semiconductor has holes or electrons as many thermally-excited carriers like an inorganic semiconductor.

Alternatively, examples of a material constituting an organic photoelectric conversion layer for photoelectrically converting light having a wavelength of a green color include a rhodamine dye, a melacyanine dye, a quinacridone derivative, a subphthalocyanine dye, pigment violet, and pigment red. Examples of a material constituting an organic photoelectric conversion layer for photoelectrically converting blue light include a coumarinic acid dye, tris-8-hydroxyquinolialuminium (Alq3), a melacyanine dye, a naphthalene derivative, an anthracene derivative, a naphthacene derivative, a styrylamine derivative, and a bis(azinyl) methene boron complex. Examples of a material constituting an organic photoelectric conversion layer for photoelectrically converting red light include a phthalocyanine dye, a subphthalocyanine dye, Nile Red, a pyran derivative such as DCM1 {4-(dicyanomethylene)-2-methyl-6-(4-dimethylaminostyryl) 4H-pyran} or DCJT {4-(dicyanomethylene)-2-tert-butyl-6-(julolidylstyryl) pyran}, a squarylium derivative, a porphyrin derivative, a chlorin derivative, and a eurogilin derivative.

Examples of a method for forming films of various organic layers include a dry film formation method and a wet film formation method. Examples of the dry film formation method include a vacuum vapor deposition method using resistance heating or high frequency heating, an EB vapor deposition method, various sputtering methods (magnetron sputtering method, RF-DC coupled bias sputtering method, ECR sputtering method, opposing target sputtering method, or high frequency sputtering method), an ion plating method, a laser ablation method, a molecular beam epitaxy method, and a laser transfer method. In addition, examples of the CVD method include a plasma CVD method, a thermal CVD method, a MOCVD method, and an optical CVD method. Meanwhile, examples of the wet method include a spin coating method, an ink jet method, a spray coating method, a stamping method, a micro contact printing method, a flexographic printing method, an offset printing method, a gravure printing method, and a dipping method. Examples of a patterning method include chemical etching such as shadow masking, laser transfer, or photolithography and physical etching using an ultraviolet ray, a laser, or the like. Examples of a technique for planarizing various organic layers include a laser planarization method and a reflow method.

Alternatively, the organic photoelectric conversion layer may be replaced with an inorganic photoelectric conversion layer containing an inorganic material. Examples of the inorganic material constituting the inorganic photoelectric conversion layer include crystalline silicon, amorphous silicon, microcrystalline silicon, crystalline selenium, amorphous selenium, a chalcopyrite compound such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, or AgInSe$_2$, a group III-V compound such as GaAs, InP, AlGaAs, InGaP, AlGaInP, or InGaAsP, and a compound semiconductor such as CdSe, CdS, In$_2$Se$_3$, In$_2$S$_3$, Bi$_2$Se$_3$, Bi$_2$S$_3$, ZnSe, ZnS, PbSe, or PbS.

Each of the third electrode and the fourth electrode may contain a transparent conductive material. Note that an electrode containing a transparent conductive material may be referred to as a "transparent electrode". Here, examples of the transparent conductive material constituting the transparent electrode include a conductive metal oxide. Specific examples thereof include indium oxide, indium-tin oxide (ITO, including Sn-doped In$_2$O$_3$, crystalline ITO, and amorphous ITO), Indium-zinc oxide (IZO) to which indium is added to zinc oxide as a dopant, indium-gallium oxide (IGO) to which indium is added to gallium oxide as a dopant, indium-gallium-zinc oxide (IGZO, In—GaZnO$_4$) to which indium and gallium are added to zinc oxide as a dopant, IFO (F-doped In$_2$O$_3$), tin oxide (SnO$_2$), ATO (Sb-doped SnO$_2$), FTO (F-doped SnO$_2$), zinc oxide (including ZnO doped with another element), aluminum-zinc oxide (AZO) to which aluminum is added to zinc oxide as a dopant, gallium-zinc oxide (GZO) to which gallium is added to zinc oxide as a dopant, titanium oxide (TiO$_2$), niobium-titanium oxide (TNO) to which niobium is added to titanium oxide as a dopant, antimony oxide, a spinel type oxide, and an oxide having a YbFe$_2$O$_4$ structure. Alternatively, examples thereof include a transparent electrode containing gallium oxide, titanium oxide, niobium oxide, nickel oxide, or the like as a base layer. The thickness of the transparent electrode may be $2\times10^{-8}$ m to $2\times10^{-7}$ m, and preferably $3\times10^{-8}$ m to $1\times10^{-7}$ m. Alternatively, in a case where transparency is not necessary, as a conductive material constituting a positive electrode functioning as an electrode for extracting holes, the positive electrode is preferably constituted by a conductive material having a high work function (for example, $\varphi=4.5$ eV to 5.5 eV). Specific examples thereof include gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te). Meanwhile, as a conductive material constituting a negative electrode functioning as an electrode for extracting electrons, the negative electrode is preferably constituted by a conductive material having a low work function (for example, $\varphi=3.5$ eV to 4.5 eV). Specific examples thereof include an alkali metal (for example, Li, Na, or K), a fluoride thereof, an oxide thereof, an alkaline earth metal (for example, Mg or Ca), a fluoride thereof, an oxide thereof, aluminum (Al), zinc (Zn), tin (Sn), thallium (Tl), a sodium-potassium alloy, an aluminum-lithium alloy, a magnesium-silver alloy, a rare earth metal such as indium or ytterbium, and an alloy thereof. Alternatively, examples of a material constituting the positive electrode or the negative electrode include a metal such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), or molybdenum (Mo), an alloy containing these metal elements, a conductive particle containing these metals, a conductive particle of an alloy containing these metals, a polysilicon containing impurities, a carbon material, an oxide semiconductor, and a conductive material such as a carbon nanotube or graphene. A laminated structure of layers containing these elements can be also used. Furthermore, examples of the material constituting the positive electrode or the negative electrode include an organic material (conductive polymer) such as poly(3,4-ethylenedioxythiophene)/polystyrene sulfonic acid [PEDOT/PSS]. In addition, these conductive materials may be mixed with a binder (polymer) to form a paste or an ink, and the paste or the ink may be cured to be used as an electrode.

As a method for forming a film of the third electrode and the like or the fourth electrode (positive electrode or negative electrode), a dry method or a wet method can be used. Examples of the dry method include a PVD method and a chemical vapor deposition method (CVD method). Examples of a film formation using the principle of the PVD method include a vacuum vapor deposition method using resistance heating or high frequency heating, an electron beam (EB) vapor deposition method, various sputtering methods (magnetron sputtering method, RF-DC coupled bias sputtering method, ECR sputtering method, opposing target sputtering method, or high frequency sputtering method), an ion plating method, a laser ablation method, a molecular beam epitaxy method, and a laser transfer method. In addition, examples of the CVD method include a plasma CVD method, a thermal CVD method, an organic metal (MO) CVD method, and an optical CVD method. Meanwhile, examples of the wet method include an electrolytic plating method, an electroless plating method, a spin coating method, an ink jet method, a spray coating method, a stamping method, a micro contact printing method, a flexographic printing method, an offset printing method, a gravure printing method, and a dipping method. Examples of a patterning method include chemical etching such as shadow masking, laser transfer, or photolithography and physical etching using an ultraviolet ray, a laser, or the like. Examples of a technique for planarizing the third electrode and the like or the fourth electrode include a laser planarization method, a reflow method, and a chemical mechanical polishing (CMP) method.

A first carrier blocking layer may be disposed between the organic photoelectric conversion layer and the third electrode, and a second carrier blocking layer may be disposed between the organic photoelectric conversion layer and the fourth electrode. In addition, a first charge injection layer may be disposed between the first carrier blocking layer and the third electrode, and a second charge injection layer may be disposed between the second carrier blocking layer and the fourth electrode. Examples of a material constituting an electron injection layer include lithium (Li), sodium (Na), potassium (K), an alkaline earth metal such as magnesium (Mg) or calcium (Ca), a fluoride thereof, and an oxide thereof.

In the lamination type light-receiving element unit, unlike a light-receiving element unit of a Bayer array (that is, spectroscopy of blue, green, and red using a color filter is not performed), if one pixel is constituted by laminating photoelectric conversion layers sensitive to light of a plurality of kinds of wavelengths in a light incident direction within the same pixel, it is possible to improve sensitivity and a pixel density per unit volume. In addition, an organic photoelectric conversion material constituting the organic photoelectric conversion layer has a high absorption coefficient. Therefore, the film thickness of the organic photoelectric conversion layer can be thinner than that of a conventional Si-based photoelectric conversion layer, and restriction on leakage of light from an adjacent pixel and an incident angle of light is relaxed. Furthermore, a false color is generated because interpolation processing is performed among pixels of three colors to generate a color signal. However, generation of the false color can be suppressed in the lamination type light-receiving element unit. The organic photoelectric conversion layer itself also acts as a color filter. Therefore, color separation can be performed even without disposing the color filter.

Each of FIGS. 24A and 24B illustrates a conceptual diagram of a lamination type light-receiving element unit. In addition, each of FIGS. 25 and 26 schematically illustrates an arrangement state of a first light-receiving element and a second light-receiving element. FIG. 27 illustrates a schematic partial end view of the imaging device of Example 9 (modification example of the imaging device of Example 1). Incidentally, in FIG. 25 or 26, "R" represents a light-receiving portion in a red light-receiving element (first light-receiving element) sensitive to red light, "G" represents a light-receiving portion in a green light-receiving element (first light-receiving element) sensitive to green light, "B" represents a light-receiving portion in a blue light-receiving element (first light-receiving element) sensitive to blue light, and "IR" represents a second light-receiving element. The second light-receiving element is indicated by a dotted line. In addition, in FIG. 27, a reference numeral 110R represents a light-receiving portion in a red light-receiving element sensitive to red light, and a reference numeral 110G represents a light-receiving portion in a green light-receiving element sensitive to green light.

The imaging device of Example 9 includes a plurality of light-receiving element units each including a second light-receiving element 120 for receiving infrared light, including a visible light cut filter, described in Examples 1 to 8, and a first light-receiving element 110 (110R, 110G) including a light-receiving portion having a laminated structure of a third electrode 113 containing a transparent conductive material, an organic photoelectric conversion layer 115, and a fourth electrode 114 containing a transparent conductive material, disposed above the second light-receiving element 120. Light is incident on the first light-receiving element 110, and infrared light that has passed through the first light-receiving element 110 is incident on the second light-receiving element 120. An interlayer insulating layer 130 transparent to the incident light is formed between the second light-receiving element 120 and the first light-receiving element 110. In addition, a second interlayer insulating layer 131 transparent to the incident light is formed between the first light-receiving element 110 and the anti-reflection film 28.

Examples of a material constituting the organic photoelectric conversion layer 115 for photoelectrically converting light having a wavelength of a green color include a rhodamine dye, a melacyanine dye, a quinacridone derivative, and a subphthalocyanine dye. Examples of a material constituting the organic photoelectric conversion layer 115 for photoelectrically converting blue light include a coumarinic acid dye, tris-8-hydryxyquinolialuminium (Alq3), and a melacyanine dye. Examples of a material constituting the organic photoelectric conversion layer 115 for photoelectrically converting red light include a phthalocyanine dye and a subphthalocyanine dye. Note that the organic photoelectric conversion layer itself also acts as a color filter. Therefore, color separation can be performed even without disposing the color filter. However, use of a color filter makes it possible to moderate a demand for spectral characteristics of blue, green, and red colors.

In the example illustrated in FIG. 25, the second light-receiving element 120, IR is disposed below each of the light-receiving portions R, G, and B. Alternatively, for example, one second light-receiving element 120 may be disposed below four light-receiving portions R, G, and B. FIG. 24B illustrates a conceptual diagram of such a configuration. FIG. 26 schematically illustrates an arrangement state of the second light-receiving element 120 and the first light-receiving element 110. That is, examples of the size of the second light-receiving element 120 include twice the size of the first light-receiving element 110, four times the size thereof, and m× n times (m and n are positive integers except for m=n=1) the size thereof broadly, but are not limited thereto. In the examples illustrated in FIGS. 24B and 26, the size of the second light-receiving element 120 is 2×2=4 times the size of the first light-receiving element 12.

A configuration and a structure in which the first light-receiving element 110 is further laminated on the first light-receiving element 110 may be adopted.

Hitherto, the present disclosure has been described on the basis of the preferable Examples. However, the present disclosure is not limited to these Examples. The configurations and structures of the light-receiving element and the imaging device in the Examples are illustrative and can be changed appropriately.

Note that the present disclosure may have the following configurations.

[A01]<<Imaging Device: First Aspect>>
An imaging device including a plurality of light-receiving elements arranged in a two-dimensional matrix shape, in which
each of the light-receiving elements includes a first electrode, a photoelectric conversion layer, and a second electrode,
the photoelectric conversion layer has a laminated structure in which a first compound semiconductor layer having a first conductivity type and a second compound semiconductor layer having a second conductivity type that is a reverse conductivity type to the first conductivity type are laminated from a side of the first electrode,
the second compound semiconductor layer has been removed in a region between the light-receiving elements,
the first electrode and the first compound semiconductor layer are shared by the light-receiving elements, and
an impurity concentration of the first compound semiconductor layer near the first electrode is lower than that of the first compound semiconductor layer near the second compound semiconductor layer.

[A02] The imaging device according to [A01], in which the first compound semiconductor layer has a two-layer structure of a first layer located on a side of the first electrode and having a low impurity concentration and a second layer located on a side of the second compound semiconductor layer and having a high impurity concentration.

[A03] The imaging device according to [A02], in which
the impurity concentration in the first layer of the first compound semiconductor layer is $1 \times 10^{14}$ cm$^{-3}$ to $5 \times 10^{15}$ cm$^{-3}$, and
the impurity concentration in the second layer of the first compound semiconductor layer is $5 \times 10^{15}$ cm$^{-3}$ to $1 \times 10^{18}$ cm$^{-3}$.

[A04] The imaging device according to [A03], in which the second layer of the first compound semiconductor layer is thinner than the first layer of the first compound semiconductor layer.

[A05] The imaging device according to any one of [A01] to [A04], in which an element isolation region including a high resistance region is formed in the first compound semiconductor layer in a region from which the second compound semiconductor layer has been removed, located between the light-receiving elements.

[A06] The imaging device according to any one of [A01] to [A05], in which an undoped third compound semiconductor layer is formed in a region from which the second compound semiconductor layer has been removed, located between the light-receiving elements.

[B01] <<Imaging Device: Second Aspect>>

An imaging device including a plurality of light-receiving elements arranged in a two-dimensional matrix shape, in which each of the light-receiving elements includes a first electrode, a photoelectric conversion layer, and a second electrode, the photoelectric conversion layer has a laminated structure in which a first compound semiconductor layer having a first conductivity type and a second compound semiconductor layer having a second conductivity type that is a reverse conductivity type to the first conductivity type are laminated from a side of the first electrode, the second compound semiconductor layer has been removed in a region between the light-receiving elements, the first electrode and the first compound semiconductor layer are shared by the light-receiving elements, and an element isolation region is formed in the first compound semiconductor layer in a region from which the second compound semiconductor layer has been removed, located between the light-receiving elements.

[B02] The imaging device according to [B01], in which the element isolation region includes a high resistance region.

[B03] The imaging device according to [B01] or [B02], in which an undoped third compound semiconductor layer is formed in a region from which the second compound semiconductor layer has been removed, located between the light-receiving elements.

[C01] The imaging device according to any one of [A01] to [B03], in which the first compound semiconductor layer includes an n-InGaAs layer, and the second compound semiconductor layer includes a p-InP layer.

[C02] The imaging device according to [C01], in which a p-AlInAs layer is formed between the first compound semiconductor layer and the second compound semiconductor layer, and the p-AlInAs layer extends in a region from which the second compound semiconductor layer has been removed, located between the light-receiving elements.

[C03] The imaging device according to any one of [A01] to [C02], in which an arrangement pitch of the light-receiving elements is 5 μm or less.

[C04] The imaging device according to any one of [A01] to [C03], in which the first electrode contains ITO, ITiO, or NiO.

[C05] The imaging device according to any one of [A01] to [C03], in which a transparent conductive material contains ITO, IZO, AZO, GZO, AlMgZnO, IGO, IGZO, IFO, ATO, FTO, $SnO_2$, ZnO, B-doped ZnO, InSnZnO, NiO, or ITiO.

[C06] The imaging device according to any one of [A01] to [C05], in which an auxiliary electrode is formed on a light incident surface of the first electrode.

[D01] The imaging device according to any one of [A01] to [C03], in which in the light-receiving element, a surface recombination preventing layer is formed between the first electrode and the first compound semiconductor layer, and the surface recombination preventing layer has a thickness of 30 nm or less.

[D02] The imaging device according to [D01], in which the surface recombination preventing layer contains InP, InGaAsP, or AlInAs.

[D03] The imaging device according to [D01] or [D02], in which the first electrode contains ITO, ITiO, or NiO.

[D04] The imaging device according to [D01] or [D02], in which the first electrode contains a transparent conductive material, the transparent conductive material contains an additive containing at least one metal selected from the group comprising molybdenum, tungsten, chromium, ruthenium, titanium, nickel, zinc, iron, and copper, or a compound thereof, and the concentration of the additive contained in the transparent conductive material near an interface of a first surface of the first electrode is higher than that of the additive contained in the transparent conductive material near a second surface of the first electrode.

[D05] The light-receiving element according to [D04], in which the transparent conductive material contains ITO, IZO, AZO, GZO, AlMgZnO, IGO, IGZO, IFO, ATO, FTO, $SnO_2$, ZnO, B-doped ZnO, InSnZnO, NiO, or ITiO.

[D06] The imaging device according to [D04] or [D05], in which the first electrode has a laminated structure of a first layer and a second layer from a side of the surface recombination preventing layer, the transparent conductive material constituting the first layer of the first electrode contains an additive, and the transparent conductive material constituting the second layer of the first electrode contains no additive.

[D07] The imaging device according to [D06], in which an average concentration of the additive contained in the transparent conductive material constituting the first layer of the first electrode is $5\times10^{16}$ $cm^{-3}$ to $1\times10^{18}$ $cm^{-3}$.

[D08] The imaging device according to [D06] or [D07], in which if an electric resistivity of the first layer of the first electrode is represented by $R_1$, an electric resistivity of the second layer of the first electrode is represented by $R_2$, a light transmittance of the first layer of the first electrode at a wavelength of 400 nm to 900 nm is represented by $TP_1$, and a light transmittance of the second layer of the first electrode is represented by $TP_2$, $0.4 \leq R_2/R_1 \leq 1.0$ and $0.8 \leq TP_2 \times TP_1 \leq 1.0$ are satisfied.

[D09] The imaging device according to any one of [D06] to [D08], in which an average light transmittance of the first electrode is 95% or more, an average electric resistivity of the first electrode is $2\times10^{-6}$ Ω·m or less, and a contact resistance value between the first electrode and the surface recombination preventing layer is $1\times10^{-8}$ Ω·$m^2$ or less.

[D10] The imaging device according to any one of [D06] to [D09], in which if a thickness of the first layer of the first electrode is represented by $T_1$ and a thickness of the second layer of the first electrode is represented by $T_2$, $2 \leq T_2/T_1 \leq 70$ is satisfied.

[D11] The imaging device according to [D108], in which $3 \leq T_1$ (nm) $\leq 60$ and $10 \leq T_2$ (nm) $\leq 350$ are satisfied.

[D12] The imaging device according to [D04] or [D05], in which a concentration of the additive contained in the transparent conductive material constituting the first electrode gradually decreases from the first surface of the first electrode toward the second surface thereof.

[E01] The imaging device according to any one of [D01] to [D12], further including a contact layer containing a compound semiconductor formed between the first electrode and the surface recombination preventing layer, in which
the contact layer has a thickness of 20 nm or less.

[E02] The imaging device according to [E01], in which the contact layer contains InGaAs, InP, or InGaAsP.

[E03] The imaging device according to [E02], in which a combination of (a compound semiconductor constituting the contact layer and a compound semiconductor constituting the surface recombination preventing layer) is (InGaAs, InP), (InGaAs, InGaAsP), (InGaAs, AlInAs), (InP, InGaAsP), (InP, AlInAs), (InGaAsP, InP), (InGaAsP, AlInAs), or (In$_X$GaAsP, In$_Y$GaAsP) [provided that X>Y is satisfied].

[F01]<<Method for Manufacturing Imaging Device: First Aspect>>

A method for manufacturing an imaging device, including:

forming, on a film formation substrate, a photoelectric conversion layer having a laminated structure in which a first compound semiconductor layer having a first conductivity type and a second compound semiconductor layer having a second conductivity type that is a reverse conductivity type to the first conductivity type are laminated, and having an impurity concentration of the first compound semiconductor layer near the film formation substrate lower than that of the first compound semiconductor layer near the second compound semiconductor layer;

then forming a second electrode in a region of the second compound semiconductor layer in which a light-receiving element should be formed, and removing the second compound semiconductor layer in a region between the light-receiving elements to obtain a plurality of light-receiving elements arranged in a two-dimensional matrix shape;

then forming an insulating layer on the entire surface, forming an opening in the insulating layer above the second electrode, and filling the opening with a conductive material to form a contact portion connected to the second electrode; and then superposing a driving substrate on which a readout integrated circuit and a connecting portion are formed and the film formation substrate such that the connecting portion and the contact portion are in contact with each other, and joining the connecting portion and the contact portion to each other.

[F02]<<Method for Manufacturing Imaging Device: Second Aspect>>

A method for manufacturing an imaging device, including:

forming, on a film formation substrate, a photoelectric conversion layer having a laminated structure in which a first compound semiconductor layer having a first conductivity type and a second compound semiconductor layer having a second conductivity type that is a reverse conductivity type to the first conductivity type are laminated;

then forming a second electrode in a region of the second compound semiconductor layer in which a light-receiving element should be formed, and removing the second compound semiconductor layer in a region between the light-receiving elements;

then forming an element isolation region in the first compound semiconductor layer in a region from which the second compound semiconductor layer has been removed, located between the light-receiving elements, on the basis of an ion implantation method to obtain a plurality of light-receiving elements arranged in a two-dimensional matrix shape;

then forming an insulating layer on the entire surface, forming an opening in the insulating layer above the second electrode, and filling the opening with a conductive material to form a contact portion connected to the second electrode; and then superposing a driving substrate on which a readout integrated circuit and a connecting portion are formed and the film formation substrate such that the connecting portion and the contact portion are in contact with each other, and joining the connecting portion and the contact portion to each other.

[F03] The method for manufacturing an imaging device according to [F01] or [F02], in which the contact portion contains copper and the connecting portion contains copper.

[F04] The method for manufacturing an imaging device according to any one of [F01] to [F03], further including: removing the film formation substrate; and forming a first electrode on the exposed first compound semiconductor layer.

[F05] The method for manufacturing an imaging device according to any one of [F01] to [F04], further including: forming an etching stop layer on the film formation substrate; and then forming a photoelectric conversion layer on the etching stop layer.

REFERENCE SIGNS LIST

10 Light-receiving element
11 Region between light-receiving elements
20 Photoelectric conversion layer
21 First compound semiconductor layer
21A First layer of first compound semiconductor layer
21B Second layer of first compound semiconductor layer
22 Second compound semiconductor layer
23 Second compound semiconductor layer/removed region
24 p-AlInAs layer
25 Passivation film
26 Insulating layer
27 Contact portion
27A Opening
28 Antireflection film
29A Planarization film
29B Filter
29C Condenser lens (on-chip lens)
31 First electrode
32 Second electrode
41 Third compound semiconductor layer
42 Element isolation region
43 Surface recombination preventing layer
44 Contact layer
50 Driving substrate
51 Connecting portion
52 Insulating material layer
60 Film formation substrate
101, 101W, 101R, 101G, 101B, 102 Light-receiving element
110, 110R, 110G First light-receiving element
113 Third electrode
114 Fourth electrode
115 Organic photoelectric conversion layer
120 Second light-receiving element
130, 131 Interlayer insulating layer

What is claimed is:

1. An imaging device, comprising:
    a plurality of light-receiving elements arranged in a two-dimensional matrix shape, wherein
    each of the light-receiving elements includes a first electrode, a photoelectric conversion layer, and a second electrode,
    the photoelectric conversion layer has a laminated structure in which a first compound semiconductor layer having a first conductivity type and a second compound semiconductor layer having a second conductivity type that is a reverse conductivity type to the first conductivity type are laminated from a side of the first electrode,
    the second compound semiconductor layer has been removed in a region between the light-receiving elements,
    the first electrode and the first compound semiconductor layer are shared by the light-receiving elements, and
    an impurity concentration of the first compound semiconductor layer near the first electrode is lower than that of the first compound semiconductor layer near the second compound semiconductor layer.

2. The imaging device according to claim 1, wherein the first compound semiconductor layer has a two-layer structure of a first layer located on a side of the first electrode and having a low impurity concentration and a second layer located on a side of the second compound semiconductor layer and having a high impurity concentration.

3. The imaging device according to claim 2, wherein
    the impurity concentration in the first layer of the first compound semiconductor layer is $1\times10^{14}$ cm$^{-3}$ to $5\times10^{15}$ cm$^{-3}$, and
    the impurity concentration in the second layer of the first compound semiconductor layer is $5\times10^{15}$ cm$^{-3}$ to $1\times10^{18}$ cm$^{-3}$.

4. The imaging device according to claim 3, wherein the second layer of the first compound semiconductor layer is thinner than the first layer of the first compound semiconductor layer.

5. The imaging device according to claim 1, wherein an element isolation region including a high resistance region is formed in the first compound semiconductor layer in a region from which the second compound semiconductor layer has been removed, located between the light-receiving elements.

6. The imaging device according to claim 1, wherein an undoped third compound semiconductor layer is formed in a region from which the second compound semiconductor layer has been removed, located between the light-receiving elements.

7. An imaging device, comprising:
    a plurality of light-receiving elements arranged in a two-dimensional matrix shape, wherein
    each of the light-receiving elements includes a first electrode, a photoelectric conversion layer, and a second electrode,
    the photoelectric conversion layer has a laminated structure in which a first compound semiconductor layer having a first conductivity type and a second compound semiconductor layer having a second conductivity type that is a reverse conductivity type to the first conductivity type are laminated from a side of the first electrode,
    the second compound semiconductor layer has been removed in a region between the light-receiving elements,
    the first electrode and the first compound semiconductor layer are shared by the light-receiving elements, and
    an element isolation region is formed in the first compound semiconductor layer in a region from which the second compound semiconductor layer has been removed, located between the light-receiving elements.

8. The imaging device according to claim 7, wherein the element isolation region includes a high resistance region.

9. The imaging device according to claim 7, wherein an undoped third compound semiconductor layer is formed in a region from which the second compound semiconductor layer has been removed, located between the light-receiving elements.

10. The imaging device according to claim 7, wherein
    the first compound semiconductor layer includes an n-InGaAs layer, and
    the second compound semiconductor layer includes a p-InP layer.

11. The imaging device according to claim 10, wherein
    a p-AlInAs layer is formed between the first compound semiconductor layer and the second compound semiconductor layer, and
    the p-AlInAs layer extends in a region from which the second compound semiconductor layer has been removed, located between the light-receiving elements.

12. The imaging device according to claim 7, wherein an arrangement pitch of the light-receiving elements is 5 µm or less.

* * * * *